(12) United States Patent
Sasajima et al.

(10) Patent No.: US 9,136,114 B2
(45) Date of Patent: Sep. 15, 2015

(54) METHOD OF MANUFACTURING SEMICONDUCTOR DEVICE, SUBSTRATE PROCESSING METHOD, COMPUTER-READABLE MEDIUM WITH PROGRAM FOR EXECUTING A SUBSTRATE PROCESSING METHOD, AND SUBSTRATE PROCESSING APPARATUS

(75) Inventors: Ryota Sasajima, Toyama (JP);
Yoshinobu Nakamura, Toyama (JP);
Yushin Takasawa, Toyama (JP);
Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 26 days.

(21) Appl. No.: 13/883,093

(22) PCT Filed: Nov. 1, 2011

(86) PCT No.: PCT/JP2011/075192
§ 371 (c)(1),
(2), (4) Date: Jun. 14, 2013

(87) PCT Pub. No.: WO2012/060379
PCT Pub. Date: May 10, 2012

(65) Prior Publication Data
US 2013/0273748 A1     Oct. 17, 2013

(30) Foreign Application Priority Data

Nov. 4, 2010 (JP) ................. 2010-247452

(51) Int. Cl.
*H01L 21/31* (2006.01)
*H01L 21/02* (2006.01)
(Continued)

(52) U.S. Cl.
CPC ........ *H01L 21/02565* (2013.01); *C23C 16/308* (2013.01); *C23C 16/45546* (2013.01);
(Continued)

(58) Field of Classification Search
CPC ..................................... C23C 16/308
See application file for complete search history.

(56) References Cited

U.S. PATENT DOCUMENTS 5,686,209 A * 11/1997 Iwamatsu et al. ............ 430/5
6,521,912 B1    2/2003 Sakama et al.
(Continued)

FOREIGN PATENT DOCUMENTS

JP    A-2001-135824    5/2001
JP    A-2001-189314    7/2001
(Continued)

OTHER PUBLICATIONS

International Search Report issued in Application No. PCT/JP2011/075192; Dated Dec. 13, 2011 (With Translation).
(Continued)

*Primary Examiner* — Zandra Smith
*Assistant Examiner* — Andre' C Stevenson
(74) *Attorney, Agent, or Firm* — Oliff PLC

(57) ABSTRACT

A method of manufacturing a semiconductor device is provided, including: forming an oxynitride film having a specific film thickness on a substrate by performing multiple numbers of times a cycle of: forming a specific element-containing layer on the substrate by supplying a source gas containing a specific element into a processing vessel in which the substrate is housed; changing the specific element-containing layer to a nitride layer by supplying a nitrogen-containing gas into the processing vessel; and changing the nitride layer to an oxynitride layer by supplying an oxygen-containing gas and an inert gas into the processing vessel, with this sequence as one cycle, wherein a composition ratio of the oxynitride film having the specific film thickness is controlled by controlling a partial pressure of the oxygen-containing gas in the processing vessel, in changing the nitride layer to the oxynitride layer.

14 Claims, 10 Drawing Sheets

(51) Int. Cl.
*C23C 16/30* (2006.01)
*C23C 16/455* (2006.01)

(52) U.S. Cl.
CPC ........ *H01L21/0214* (2013.01); *H01L 21/0228* (2013.01); *H01L 21/02211* (2013.01); *H01L 21/02274* (2013.01)

(56) References Cited

U.S. PATENT DOCUMENTS

| | | | | |
|---|---|---|---|---|
| 6,586,056 | B2 * | 7/2003 | Arkles et al. | 427/582 |
| 7,358,198 | B2 * | 4/2008 | Aoki et al. | 438/769 |
| 7,759,747 | B2 * | 7/2010 | Forbes et al. | 257/411 |
| 7,811,945 | B2 * | 10/2010 | Sasaki | 438/771 |
| 8,007,589 | B2 * | 8/2011 | Hwang et al. | 118/715 |
| 8,426,117 | B2 * | 4/2013 | Hasebe et al. | 430/314 |
| 2004/0007748 | A1 | 1/2004 | Sakama et al. | |
| 2005/0263835 | A1 | 12/2005 | Sakama et al. | |
| 2007/0010071 | A1 | 1/2007 | Matsuura | |
| 2007/0029626 | A1 | 2/2007 | Sakama et al. | |
| 2008/0305647 | A1 | 12/2008 | Matsushita et al. | |
| 2009/0170345 | A1 | 7/2009 | Akae et al. | |
| 2011/0003481 | A1 | 1/2011 | Matsushita et al. | |

FOREIGN PATENT DOCUMENTS

| | | |
|---|---|---|
| JP | A-2007-019145 | 1/2007 |
| JP | A-2007-123825 | 5/2007 |
| JP | A-2010-010497 | 1/2010 |
| JP | A-2010-050425 | 3/2010 |
| JP | A-2010-062230 | 3/2010 |

OTHER PUBLICATIONS

International Preliminary Report on Patentability Issued in Application No. PCT/JP2011/075192; Dated May 8, 2013.

* cited by examiner

METHOD OF MANUFACTURING SEMICONDUCTOR DEVICE, SUBSTRATE PROCESSING METHOD, COMPUTER-READABLE MEDIUM WITH PROGRAM FOR EXECUTING A SUBSTRATE PROCESSING METHOD, AND SUBSTRATE PROCESSING APPARATUS

TECHNICAL FIELD

The present invention relates to a method of manufacturing a semiconductor device including a step of forming a thin film on a substrate, a substrate processing method and a substrate processing apparatus.

DESCRIPTION OF RELATED ART

A manufacturing step of a semiconductor device includes a step of forming a silicon-based insulating film such as a silicon oxide film ($SiO_2$ film) and a silicon nitride film ($Si_3N_4$ film) and a silicon oxynitride film (SiON film), on a wafer such as a silicon wafer, etc. If a composition (also called a composition ratio hereafter) of such a silicon-based insulating film is changed, a wet etching rate (also called WER hereafter), a dry etching rate (also called DER hereafter), a dielectric constant ($\in$), a refractive index (R1), etc., of a film are also changed. WER and DER are important parameters for controlling processability of the film during manufacture of a semiconductor integrated circuit device (also called IC hereafter) as a semiconductor device. Further, the dielectric constant is a parameter having an influence on electric properties of an inter-layer insulating film of IC. Also, the refractive index is an important parameter for controlling refraction/reflection of a light when forming an optical device.

Formation of the silicon oxide film and the silicon nitride film having a stoichiometric composition, has been a mainstream in forming the silicon-based insulating film by a conventional CVD method. However, the silicon nitride film with high ratio of silicon can be created by supplying and exhausting raw materials such as a silicon-containing gas and a nitrogen-containing gas for example alternately, which are required for film formation (for example, see patent document 1). Also, similarly, the silicon oxide film and the silicon oxynitride film can be formed by supplying and exhausting raw materials such as the silicon-containing gas, the nitrogen-containing gas, and the oxygen-containing gas alternately, which are required for film formation (for example, see patent document 2).

PRIOR ART DOCUMENT

Patent Document

Patent Document 1:
Japanese Patent Laid Open Publication No. 2010-62230
Patent Document 2:
Japanese Patent Laid Open Publication No. 2010-50425

SUMMARY OF THE INVENTION

Problem to be Solved by the Invention

It is found by inventors of the present invention, that when the silicon-containing gas, the nitrogen-containing gas, and the oxygen-containing gas are alternately supplied and exhausted to thereby form the silicon oxynitride film, the composition of the silicon oxynitride film can be controlled by controlling a supply time of the oxygen-containing gas, whereby it is also found that the WER properties and RI of the silicon oxynitride film can be controlled. However, for example, when a value of RI of the silicon oxynitride film is set to be low, and WER thereof is set to be high, the supply time of the oxygen-containing gas is required to be prolonged, thus causing a film forming rate to be lower.

Accordingly, an object of the present invention is to provide a method of manufacturing a semiconductor device, a substrate processing method and a substrate processing apparatus, capable of controlling a composition of a film, without decreasing a film forming rate.

Means for Solving the Problem

According to an aspect of the present invention, there is provided a method of manufacturing a semiconductor device, including:

forming an oxynitride film having a specific film thickness on a substrate by performing multiple numbers of times a cycle of:

forming a specific element-containing layer on the substrate by supplying a source gas containing a specific element into a processing vessel in which the substrate is housed;

changing the specific element-containing layer to a nitride layer by supplying a nitrogen-containing gas into the processing vessel; and changing the nitride layer to an oxynitride layer by supplying an oxygen-containing gas and an inert gas into the processing vessel, with this sequence as one cycle, wherein a composition ratio of the oxynitride film having the specific film thickness is controlled by controlling a partial pressure of the oxygen-containing gas in the processing vessel, in changing the nitride layer to the oxynitride layer.

According to other aspect of the present invention, there is provided a substrate processing method, including:

forming an oxynitride film having a specific film thickness on a substrate by performing multiple numbers of times a cycle of:

forming a specific element-containing layer on the substrate by supplying a source gas containing a specific element into a processing vessel in which the substrate is housed;

changing the specific element-containing layer to a nitride layer by supplying a nitrogen-containing gas into the processing vessel; and changing the nitride layer to an oxynitride layer by supplying an oxygen-containing gas and an inert gas into the processing vessel, with this sequence as one cycle, wherein a composition ratio of the oxynitride film having the specific film thickness is controlled by controlling a partial pressure of the oxygen-containing gas in the processing vessel, in changing the nitride layer to the oxynitride layer.

According to further other aspect of the present invention, there is provided a substrate processing apparatus, including:

a processing vessel configured to house a substrate;

a source gas supply system configured to supply a source gas containing a specific element into the processing vessel;

a nitrogen-containing gas supply system configured to supply a nitrogen-containing gas into the processing vessel;

an oxygen-containing gas supply system configured to supply an oxygen-containing gas into the processing vessel;

an inert gas supply system configured to supply an inert gas into the processing vessel;

a partial pressure control system configured to control a partial pressure of a gas in the processing vessel; and a control part configured to control the source gas supply system, the nitrogen-containing gas supply system, the oxygen-containing gas supply system, the inert gas supply system, and the partial pressure control system, so as to perform processing of forming an oxynitride film having a specific film thickness on the substrate by performing multiple numbers of times a cycle of process of forming a specific element-containing layer on the substrate by supplying the source gas into the processing vessel in which the substrate is housed, a process of changing the specific element-containing layer to a nitride layer by supplying the nitrogen-containing gas into the processing vessel, and a process of changing the nitride layer to an oxynitride layer by supplying the oxygen-containing gas and the inert gas into the processing vessel, with these processes as one cycle, and so as to control a composition ratio of the oxynitride film having the specific film thickness by controlling a partial pressure of the oxygen-containing gas in the processing vessel, in the process of changing the nitride layer to the oxynitride layer.

Advantage of the Invention

According to the present invention, there are provided a method of manufacturing a semiconductor device, a substrate processing method and a substrate processing apparatus, capable of controlling a composition of a film, without reducing a film forming rate.

DETAILED DESCRIPTION OF THE INVENTION

Embodiments of the present invention will be described hereafter based on the drawings.

Figure 1:
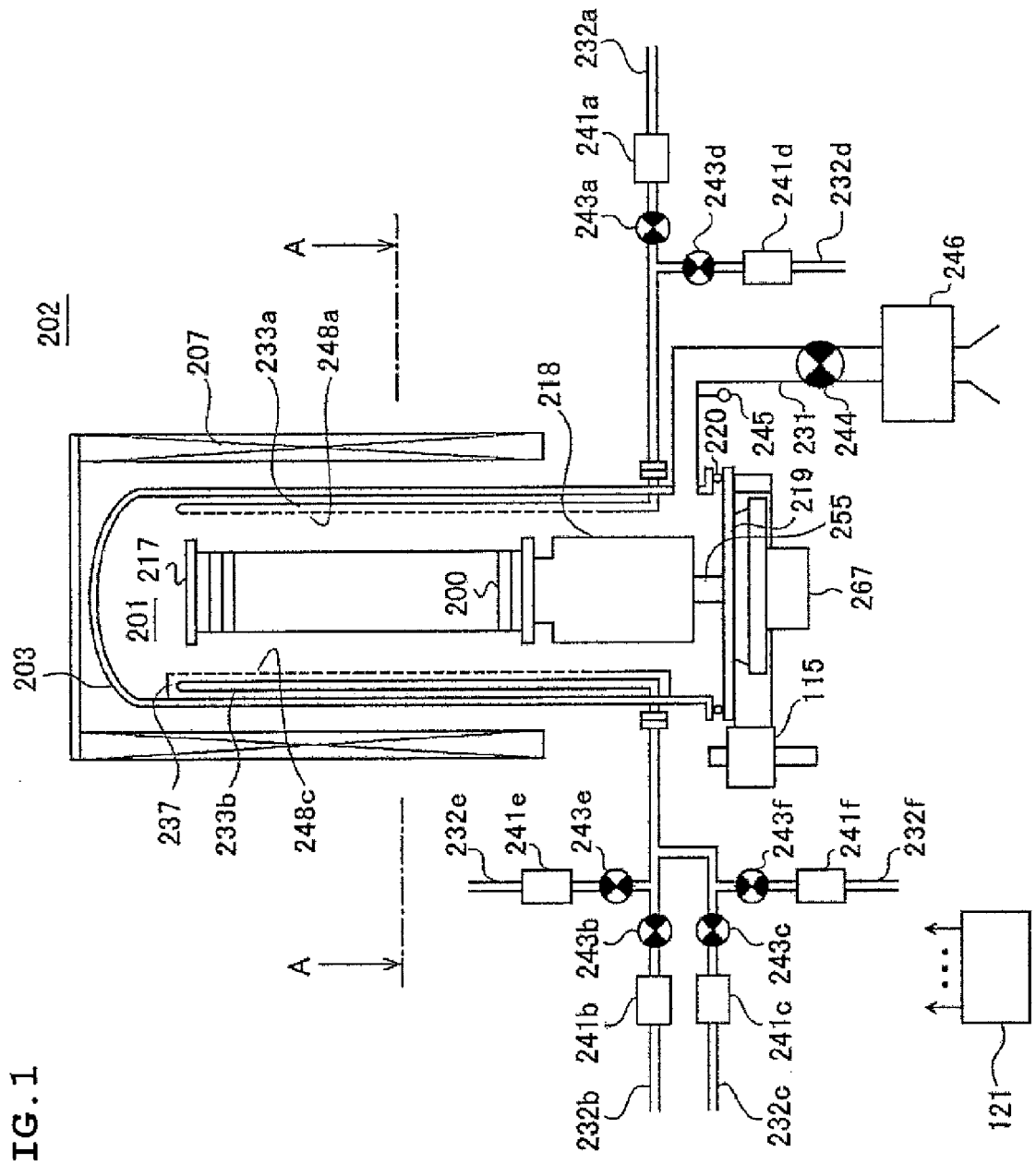
FIG. 1 is a schematic block diagram of a vertical processing furnace of a substrate processing apparatus suitably used in this embodiment, and is a view showing the processing furnace portion in a vertical cross-sectional view.
Figure 2:
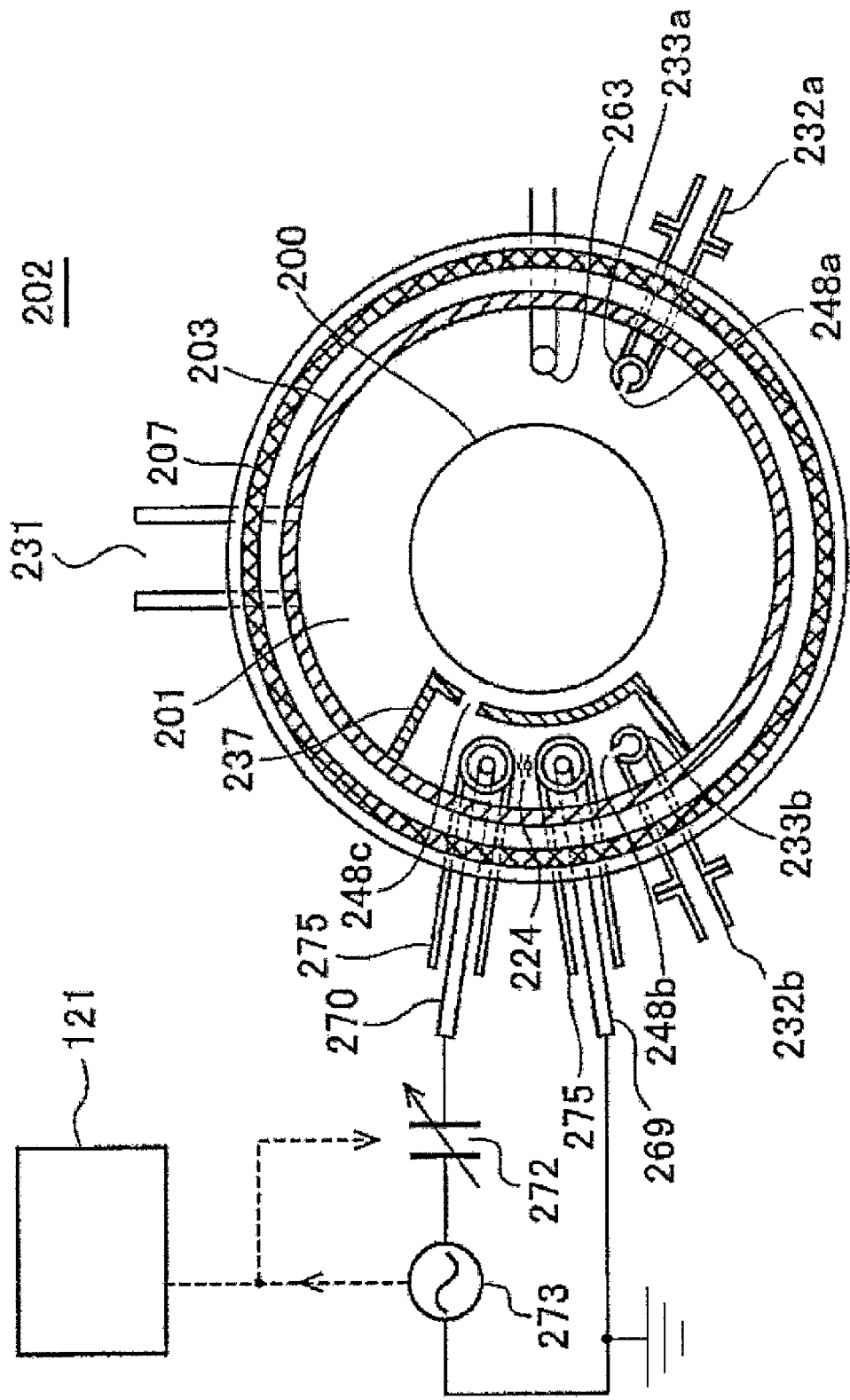
FIG. 2 is a schematic block diagram of the vertical processing furnace of the substrate processing apparatus suitably used in this embodiment, and is a view showing the processing furnace portion taken along the line A-A of FIG. 1.

FIG. 1 is a schematic block diagram of a vertical processing furnace of a substrate processing apparatus suitably used in this embodiment, and is a view showing a processing furnace 202 portion in a vertical cross-sectional view. FIG. 2 is a schematic block diagram of the vertical processing furnace of the substrate processing apparatus suitably used in this embodiment, and is a view showing the processing furnace portion taken along the line A-A of FIG. 1. Note that the present invention is suitably applied not only to the substrate processing apparatus of this embodiment, but also to a substrate processing apparatus having a single wafer type, Hot Wall type, Cold Wall type processing furnaces.

As shown in FIG. 1, a processing furnace 202 has a heater 207 as a heating unit (heating mechanism). The heater 207 has a cylindrical shape, and is vertically installed on a heater base (not shown) as a holding plate by being supported thereby. The heater 207 also functions as an activation mechanism of activating a gas by heat as will be described later.

A reaction tube 203 constituting a reaction vessel (processing vessel) is disposed inside of the heater 207 concentrically with the heater 207. The reaction tube 203 is made of a heat-resistant material such as quartz ($SiO_2$) or silicon carbide (SiC), etc., for example, and is formed into a cylindrical shape, with an upper end closed and a lower end opened. A process chamber 201 is formed in a cylinder hollow part of the reaction tube 203, so that wafers 200 being substrates, can be stored by a boat in a state of being vertically arranged in multiple stages in a horizontal posture.

A first nozzle 233a as a first gas introducing part, and a second nozzle 233b as a second gas introducing part, are provided inside of the process chamber 201 so as to pass through a lower side wall of the reaction tube 203. A first gas supply tube 232a and a second gas supply tube 232b are respectively connected to the first nozzle 233a and the second nozzle 233b. A third gas supply tube 232c is connected to the second gas supply tube 232b. Thus, the reaction tube 203 includes two nozzles 233a, 233b, and three gas supply tubes 232a, 232b, 232c, so that a plurality of kinds of gases, three kinds of gases here, can be supplied into the process chamber 201.

A mass flow controller (MFC) 241a being a flow rate control unit (flow rate control part) and a valve 243a being an open/close valve are provided on the first gas supply tube 232a sequentially from an upstream direction. Further, a first inert gas supply tube 232d is connected to a downstream side of the valve 243a of the first gas supply tube 232a. A mass flow controller 241d being a flow rate control unit (flow rate control part), and a valve 243d being an open/close valve are provided on the first inert gas supply tube 232d sequentially from the upstream direction. Further, the above-mentioned first nozzle 233a is connected to a tip part of the first gas supply tube 232a. The first nozzle 233a is provided in an arc-shaped space between an inner wall of the reaction tube 203 and the wafers 200, extending from a lower part to an upper part of the inner wall of the reaction tube 203, so as to rise toward an upper part of a stacking direction of the wafers 200. Namely, the first nozzle 233a is provided in a region horizontally surrounding a wafer arrangement region, at a side part of the wafer arrangement region in which the wafers 200 are arranged, along the wafer arrangement region. The first nozzle 233a is formed as an L-shaped long nozzle, with its horizontal part provided so as to pass through a lower side wall of the reaction tube 203, and with its vertical part provided so as to rise from at least one end side of the wafer arrangement region toward the other end side. Gas supply holes 248a for supplying a gas, are provided on a side face of the first nozzle 233a. Each gas supply hole 248a is opened to face a center of the reaction tube 203, so that the gas can be supplied toward the wafers 200. A plurality of gas supply holes 248a are provided extending from a lower part to an upper part of the reaction tube 203, each of them having the same opening area and provided at the same opening pitch.

A first gas supply system is mainly constituted of the first gas supply tube 232a, the mass flow controller 241a, and the valve 243a. The first nozzle 233a may be included in the first gas supply system. Also, a first inert gas supply system is mainly constituted of the first inert gas supply tube 232d, the mass flow controller 241d, and the valve 243d. The first inert gas supply system also functions as a purge gas supply system.

A mass flow controller (MFC) 241h being a flow rate control unit (flow rate control part), and a valve 243b being an open/close valve, are provided on the second gas supply tube 232b, sequentially from the upstream direction. Further, a second inert gas supply tube 232e is connected to a downstream side of the valve 243b of the second gas supply tube 232b. A mass flow controller 241e being a flow rate control unit (flow rate control part), and a valve 243e being an open/close valve, are provided on the second inert gas supply tube 232e sequentially from an upstream direction. Further, the second nozzle 233b is connected to the tip part of the second gas supply tube 232b. The second nozzle 233b is provided in a buffer chamber 237 being a gas dispersion space.

The buffer chamber 237 is provided in the arc-shaped space between the inner wall of the reaction tube 203 and the wafers 200, extending from the lower part to the upper part of the inner wall of the reaction tube 203, along the stacking direction of the wafers 200. Namely, the buffer chamber 237 is provided in the region horizontally surrounding the wafer arrangement region, at the side part of the wafer arrangement region, along the wafer arrangement region. Similarly to the first nozzle 233a, it can be said that the buffer chamber 237 is provided so as to rise from at least one end side of the wafer arrangement region toward the other end side. Gas supply holes 248c for supplying a gas, are provided on an end portion of a wall adjacent to the wafers 200 of the buffer chamber 237. Each gas supply hole 248c is opened to face the center of the reaction tube 203, so that the gas can be supplied toward the wafers 200. A plurality of gas supply holes 248a are provided extending from the lower part to the upper part of the reaction tube 203, each of them having the same opening area and provided at the same opening pitch.

The second nozzle 233b is provided on the end portion at an opposite side to the end portion where the gas supply holes 248c of the buffer chamber 237, extending to the upper part from the lower part of the inner wall of the reaction tube 203, so as to rise toward the upper part of the stacking direction of the wafers 200. Namely, the second nozzle 233b is provided in a region horizontally surrounding the wafer arrangement region, at the side part of the wafer arrangement region, along the wafer arrangement region. The second nozzle 233b is formed as an L-shaped long nozzle, with its horizontal part provided so as to pass through the lower side wall of the reaction tube 203, and with its vertical part provided so as to rise from at least one end side of the wafer arrangement region toward the other end side. Gas supply holes 248b for supplying a gas, are provided on a side face of the second nozzle 233b. Each gas supply hole 248b is opened to face a center of the buffer chamber 237. Similarly to the gas supply holes 248c of the buffer chamber 237, a plurality of gas supply holes 248b are provided, extending to the upper part from the lower part of the reaction tube 203. Each of the plurality of gas supply holes 248b may be opened in the same opening area at the same opening pitch from the upstream side (lower part) to the downstream side (upper part) when a differential pressure is small between inside of the buffer chamber 237 and inside of the process chamber 201. Meanwhile, when the differential pressure is large, each opening area may be large or opening pitch may be small, toward the downstream side from the upstream side.

In this embodiment, by adjusting the opening area and the opening pitch of each of the gas supply holes 248b of the second nozzle 233b as described above from the upstream side to the downstream side, the gas with the flow rate adjusted to be approximately the same, although there is a difference in a flow velocity, is sprayed from each of the gas supply holes 248b. Then, the gas sprayed form each of the gas supply holes 248b is introduced once into the buffer chamber 237, and a difference in the flow velocity of the gas is made uniform in the buffer chamber 237. Namely, the gas sprayed into the buffer chamber 237 from each of the gas supply holes 248b of the second nozzle 233b, is sprayed into the process chamber 201 from the gas supply holes 248c of the buffer chamber 237, with a particle velocity of each gas relaxed in the buffer chamber 237. Thus, the gas sprayed into the buffer chamber 237 from each of the gas supply holes 248b of the second nozzle 233b, becomes the gas having a uniform flow rate and flow velocity, when being sprayed into the process chamber 201 from each of the gas supply holes 248c of the buffer chamber 237.

A second gas supply system is mainly constituted of the second gas supply tube 232b, the mass flow controller 241b, and the valve 243b. The second nozzle 233b and the buffer chamber 237 may be included in the second gas supply system. Further, a second inert gas supply system is mainly constituted of the second inert gas supply tube 232e, the mass flow controller 241e, and the valve 243e. The second inert gas supply system also functions as the purge gas supply system.

A mass flow controller (MFC) 241c being a flow rate control unit (flow rate control part), and a valve 243c being an open/close valve, are provided on the third gas supply tube 232c sequentially from the upstream side. Further, a third inert gas supply tube 232f is connected to the downstream side of the valve 243c of the third gas supply tube 232c. A mass flow controller 241f being a flow rate control unit (flow rate control part), and a valve 243f being an open/close valve, are provided on the third inert gas supply tube 232f sequentially from the upstream side. Further, the tip part of the third gas supply tube 232c is connected to the downstream side of the valve 243b of the second gas supply tube 232b.

A third gas supply system is mainly constituted of the third gas supply tube 232c, the mass flow controller 241c, and the valve 243c. The downstream side of the connection part connecting to the third gas supply tube 232c of the second gas supply tube 232b, the second nozzle 233b, and the buffer chamber 237 may also be included in the third gas supply system. Also, a third inert gas supply system is mainly constituted of the third inert gas supply tube 232f, the mass flow controller 241f, and the valve 243f. The third inert gas supply system also functions as the purge gas supply system.

A source gas containing a specific element, namely, hexachlorodisilane gas ($Si_2Cl_6$, abbreviated as HCD) for example, as the source gas containing silicon (Si) being the specific element, is supplied from the first gas supply tube 232a into the process chamber 201, through the mass flow controller 241a, the valve 243a, and the first nozzle 233a. Namely, the first gas supply system is configured as a source gas supply system (silicon-containing gas supply system). When a liquid source in a liquid state under ordinary temperature and normal pressure is used, the liquid source is vaporized by a vaporizer or a vaporizing system such as a bubbler, and is supplied as the source gas. Simultaneously at this time, the inert gas may be supplied into the first gas supply tube 232a from the first inert gas supply tube 232d, through the mass flow controller 241d and the valve 243d. The inert gas supplied into the first gas supply tube 232a is supplied into the process chamber 201 together with the HCD gas through the first nozzle 233a.

An ammonia ($NH_3$) gas for example, is supplied into the process chamber 201 from the second gas supply tube 232b as a gas containing nitrogen (nitrogen-containing gas), through the mass flow controller 241b, the valve 243b, the second nozzle 233b, and the buffer chamber 237. Namely, the second gas supply system is configured as a nitrogen-containing gas supply system. Simultaneously at this time, the inert gas may be supplied into the second gas supply tube 232b from the second inert gas supply tube 232e, through the mass flow controller 241e and the valve 243e.

An oxygen ($O_2$) gas for example, is supplied into the process chamber 201 from the third gas supply tube 232c as a gas containing oxygen (oxygen-containing gas), through the mass flow controller 241c, the valve 243c, the second gas supply tube 232b, the second nozzle 233b, and the buffer chamber 237. Namely, the third gas supply system is configured as an oxygen-containing gas supply system. Simultaneously at this time, the inert gas may be supplied into the third gas supply tube 232c, through the mass flow controller 241f and the valve 243f.

In this embodiment, the $NH_3$ gas and the $O_2$ gas are supplied into the process chamber 201 (into the buffer chamber 237) from the same nozzle. However, each gas may be supplied into the process chamber 201 from different nozzles respectively. However, if the nozzle is shared by a plurality of gases, there is a merit that the number of nozzles can be reduced, an apparatus cost can be reduced, and a maintenance is easy.

As shown in FIG. 2, a first rod electrode 269 being a first electrode and a second rod electrode 270 being a second electrode having a long shape respectively, are arranged along the stacking direction of the wafers 200 extending from the lower part to the upper part of the reaction tube 203. Each of the first rod electrode 269 and the second rod electrode 270 is provided in parallel to the second nozzle 233b. Each of the first rod electrode 269 and the second rod electrode 270 is protected by being covered by an electrode protective tube 275 being a protective tube for protecting each electrode from the upper part to the lower part. One of the first rod electrode 269 and the second rod electrode 270 is connected to a high frequency power source 273 via an impedance matching box 272, and other one is connected to earth being a reference electric potential. As a result, plasma is generated in a plasma generation region 224 between the first rod electrode 269 and the second rod electrode 270. A plasma source is mainly constituted of the first rod electrode 269, the second rod electrode 270, the electrode protective tube 275, the impedance matching box 272, and the high frequency power source 273, as a plasma generator (plasma generation part). The plasma source functions as an activation mechanism of activating a gas by plasma as will be described later.

The electrode protective tube 275 is configured to insert each of the first rod electrode 269 and the second rod electrode 270 into the buffer chamber 237 in a state of being isolated from an atmosphere of the buffer chamber 237. Here, if the inside of the electrode protective tube 275 is set in the same atmosphere as the outside air (atmosphere), the first rod electrode 269 and the second rod electrode 270 inserted into the electrode protective tube 275 respectively, are oxidized by heat of the heater 207. Therefore, an inert gas purge mechanism is provided inside of the electrode protective tube 275 for filling or purging the inside with the inert gas such as nitrogen, thus suppressing an oxygen concentration to be sufficiently low, to thereby prevent an oxidation of the first rod electrode 269 or the second rod electrode 270.

An exhaust tube 231 for exhausting the atmosphere in the process chamber 201, is provided in the reaction tube 203. A vacuum pump 246 being a vacuum exhaust device is connected to the exhaust tube 231, through a pressure sensor 245 being a pressure detector (pressure detection part) for detecting a pressure in the process chamber 201, and an APC (Auto Pressure Controller) valve 244 being a pressure adjuster (pressure adjustment part). The APC valve 244 is configured to perform vacuum exhaust/stop of vacuum exhaust in the process chamber 201 by opening and closing the valve in a state of operating the vacuum pump 246, and further is configured to adjust the pressure in the process chamber 201 by adjusting an opening degree of the valve based on pressure information detected by the pressure sensor 245 in a state of operating the vacuum pump 246. An exhaust system is mainly constituted of the exhaust tube 231, the APC valve 244, the vacuum pump 246, and the pressure sensor 245. A pressure control system (total pressure control system) of controlling the pressure (total pressure) in the process chamber is mainly constituted of the APC valve 244, the vacuum pump 246, and the pressure sensor 245.

Control of the pressure in the process chamber 201, namely, control of the total pressure in the process chamber 201, is performed by adjusting the opening degree of the valve of the APC valve based on the pressure information detected by the pressure sensor 245 as described above. At this time, control of the partial pressure of the specific gas in the process chamber 201, such as the HCD gas, $NH_3$ gas, and the $O_2$ gas, can also be controlled. For example, when the flow rate of the HCD gas is indicated by Qh, the flow rate of the $NH_3$ gas is indicated by Qn, the flow rate of the $Q_2$ gas is indicated by Qo, the flow rate of a diluting $N_2$ gas is indicated by Qd, and the pressure (total pressure) in the process chamber is indicated by V, partial pressure Vh of the HCD gas, partial pressure Vn of the $NH_3$ gas, and partial pressure Vo of the $O_2$ gas, are expressed by the following formula.

$$Vh=[Qh/(Qh+Qd)]\times V \qquad \text{(Formula 1)}$$

$$Vn=[Qn/(Qn+Qd)]\times V \qquad \text{(Formula 2)}$$

$$Vo=[Qo/(Qo+Qd)]\times V \qquad \text{(Formula 3)}$$

Namely, by controlling the total pressure V in the process chamber 201, the flow rate Qh of the HCD gas, and the flow rate Qd of the diluting $N_2$ gas based on the formula 1, the partial pressure Vh of the HCD gas in the process chamber 201 can be controlled. Further, by controlling the total pressure V in the process chamber, the flow rate Qn of the $NH_3$ gas, the flow rate Qd of the diluting $N_2$ gas based on the formula 2, the partial pressure Vn of the $NH_3$ gas in the process chamber 201 can be controlled. Also, by controlling the total pressure V in the process chamber, the flow rate Qo of the $O_2$ gas, and the flow rate Qd of the diluting $N_2$ gas based on the formula 3, the partial pressure Vo of the $O_2$ gas in the process chamber 201 can be controlled. A partial pressure control system is mainly constituted of the APC valve 244, the vacuum pump 246, the pressure sensor 245, the mass flow controllers 241a, 241b, 241c, 241d, 241e, and 241f.

A seal cap 219 as a furnace throat lid member capable of air-tightly closing a lower end opening of the reaction tube 203, is provided in a lower part of the reaction tube 203. The seal cap 219 is configured to abut on the lower end of the reaction tube 203 from a vertical lower side. The seal cap 219 is made of metal such as stainless, etc., and is formed into a disc shape. An O-ring 220 as a seal member abutted on the lower end of the reaction tube 203, is provided on an upper surface of the seal cap 219. A rotation mechanism 267 for rotating a boat 217 as a substrate holding tool described later, is installed on an opposite side of the process chamber 201 across the seal cap 129. A rotary shaft 255 of the rotation mechanism 267 is passed through the seal cap 219 and is connected to the boat 217. The rotation mechanism 267 is configured to rotate the wafer 200 by rotating the boat 217. The seal cap 219 is configured to be vertically elevated by a boat elevator 115 as an elevation mechanism vertically installed outside of the reaction tube 203. The boat elevator 115 is configured to load and unload the boat 217 into/from the process chamber 201 by elevating the seal cap 219.

The boat 217 as a substrate supporting tool, is made of a heat-resistant material such as quartz and silicon carbide, etc., and is configured to support a plurality of wafers 200 in a horizontal posture, with centers thereof aligned, arranged in multiple stages. A heat insulating member 218 made of the heat-resistant material such as quartz and silicon carbide, etc., is provided in a lower part of the boat 217, so that a heat from the heater 207 is hardly transmitted to the seal cap 219 side. The heat-insulating member 218 may also be configured by a plurality of heat-insulating plates made of the heat-resistant material such as quartz and silicon carbide, etc., and a heat-insulating plate holder for supporting these heat-insulting plates in a horizontal posture in multiple stages.

A temperature sensor 263 as a temperature detector, is installed in the reaction tube 203, and by adjusting a power supply state to the heater 207 based on the temperature information detected by the temperature sensor 263, the temperature in the process chamber 201 is set to have a desired temperature distribution. Similarly to the first nozzle 233a and the second nozzle 233b, the temperature sensor 263 is formed into the L-shape, and is provided along the inner wall of the reaction tube 203.

Figure 10:
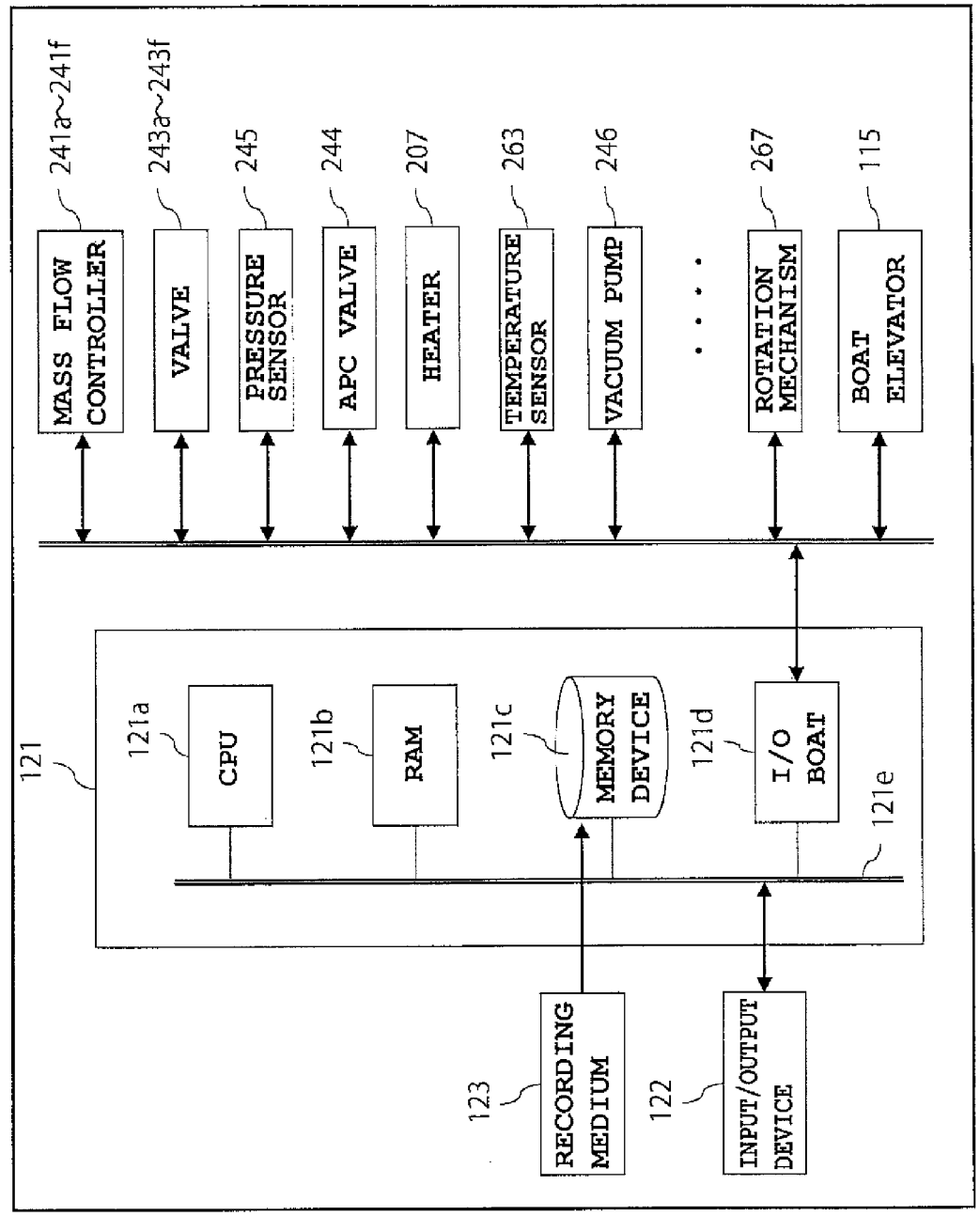
FIG. 10 is a schematic block diagram of a controller of a substrate processing apparatus suitably used in this embodiment.

As shown in FIG. 10, the controller 121 being the control part (control unit), is configured as a computer including CPU (Central Processing Unit) 121a, RAM (Random Access Memory) 121b, a memory device 121c, and I/O port 121d. The RAM 121b, the memory device 121c, and the I/O port 121d are configured to perform data exchange with CPU 121a via an internal bus 121e. An input/output device 122 configured as a touch panel, etc., is connected to the controller 121.

The memory device 121c includes a flash memory, HDD (Hard Disk Drive), etc., for example. A control program for controlling an operation of the substrate processing apparatus, and a process recipe, etc., indicating a procedure and a condition, etc., of substrate processing as will be descried later, are readably stored in the memory device 121c. The process recipe is a combination of recipes, so that each procedure in a substrate processing step described later is executed by the controller 121 to obtain a specific result, and functions as a program. The process recipe and the control program, etc., are generally simply called a program. The RAM 121b is configured as a memory area (work area) in which the program and data, etc., read by the CPU 121a are temporarily stored.

The I/O port 121d is connected to the above-mentioned mass flow controllers 241a, 241b, 241c, 241d, 241e, 241f, valves 243a, 243b, 243c, 243d, 243e, 243f, pressure sensors 245, APC valve 244, vacuum pump 246, heater 207, temperature sensor 263, rotation mechanism 267, boat elevator 115, high frequency power source 273, and impedance matching box 272, etc.

The CPU 121a is configured to read and execute the control program from the memory device 121c, and is configured to read the process recipe from the memory device 121c according to an input, etc., of an operation command from the input/output device 122. Then, the CPU 121a is configured to control a flow rate adjustment operation of each kind of gas by the mass flow controllers 241a, 241b, 241c, 241d, 241e, and 241f, an open/close operation of the valves 243a, 243b, 243c, 243d, 243e, and 243f, an open/close operation of the APC valve 244, a pressure adjustment operation based on the pressure sensor 245 by the APC valve 244, a temperature adjustment operation of the heater 207 based on the temperature sensor 263, start/stop of the vacuum pump 246, a rotation speed adjustment operation of the rotation mechanism 267, an elevating operation of the boat 217 by the boat elevator 115, power supply by the high frequency power source 273, and an impedance adjustment operation by the impedance matching box 272, or the like.

The controller 121 may be configured not only as a dedicated computer, but also as a general-purpose computer. For example, a computer-readable recording medium storing the above-mentioned program (for example, a magnetic tape, a magnetic disc such as a flexible disc and a hard disc, etc., an optical disc such as CD and DVD, et., an optical magnetic disc such as MO, etc., and a semiconductor memory such as a TJSB memory and a memory card, etc.) 123, is prepared, and by using the recording medium 123, the program is installed in the general-purpose computer, to thereby constitute the controller 121 according to this embodiment. Means for supplying the program to the computer, is not limited to a case of supplying it through the recording medium 123. For example, communication means such as Internet and a dedicated line, etc., may be used, to thereby supply the program not through the recording medium 123.

Next, explanation is given for a sequence example in which the processing furnace of the substrate processing apparatus is used, to thereby form an oxynitride film on the substrate as an insulating film, as one step of the manufacturing step of the semiconductor device. In the explanation hereafter, an operation of each part constituting the substrate processing apparatus is controlled by the controller 121.

Figure 3:
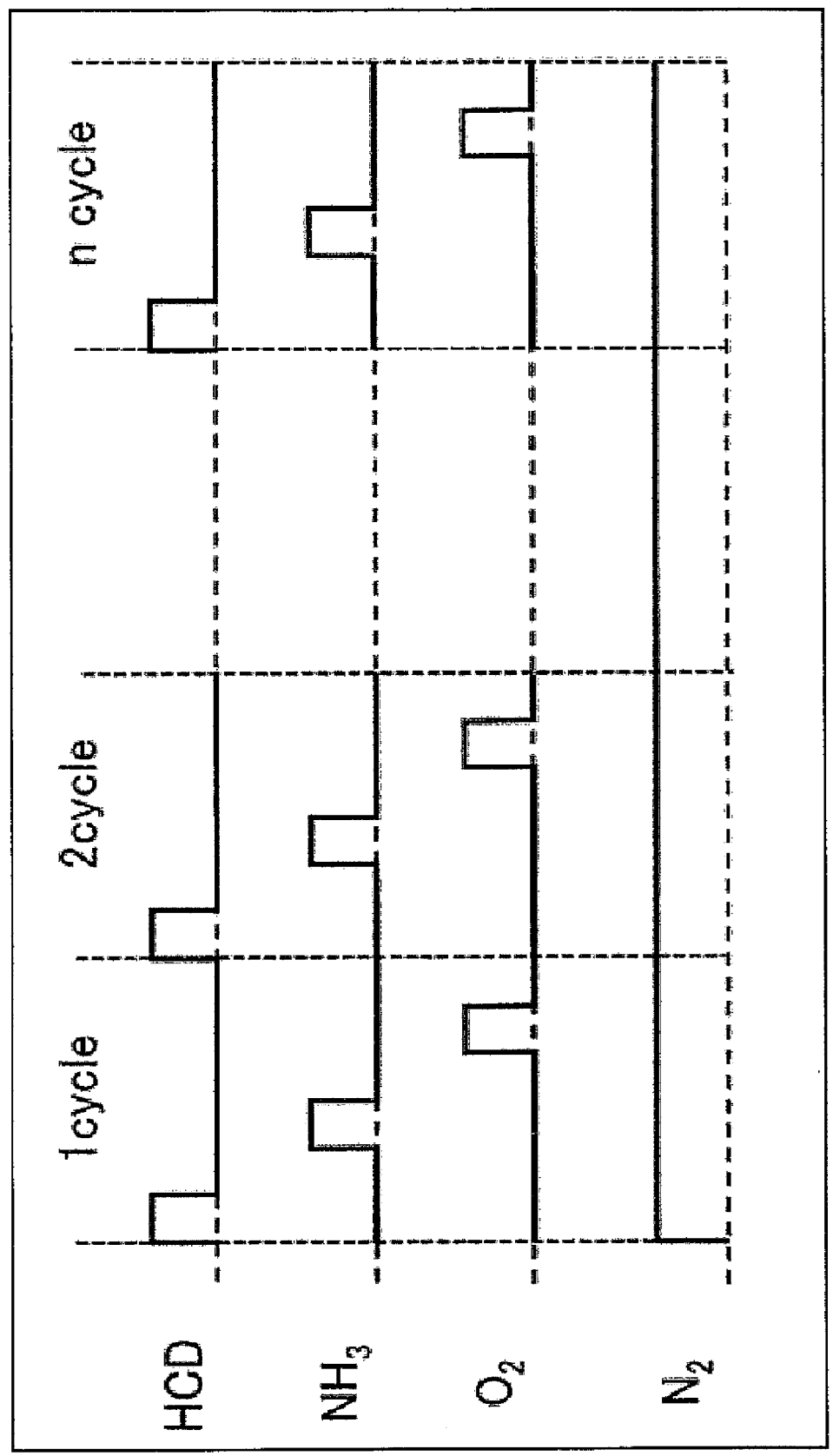
FIG. 3 is a view showing a timing of a gas supply in a film formation sequence of this embodiment.

FIG. 3 shows a timing view of a gas supply in a film formation sequence of this embodiment. In the film formation sequence of this embodiment, the oxynitride film having a specific film thickness is formed on the substrate by performing multiple numbers of times a cycle of forming a specific element-containing layer on the substrate by supplying a source gas (HCD gas) containing a specific element into the processing vessel in which the substrate is housed; changing the specific element-containing layer to a nitride layer by supplying the nitrogen-containing gas ($NH_3$ gas) into the processing vessel; and changing the nitride layer to an oxynitride layer by supplying the oxygen-containing gas ($O_2$ gas) and the inert gas ($N_2$ gas) into the processing vessel, with this sequence as one cycle. Then, by controlling the partial pressure of the oxygen-containing gas in the processing vessel in changing the nitride layer to the oxynitride layer, the composition of the oxynitride film having the specific film thickness is controlled.

Explanation is given hereafter more specifically. In this embodiment, explanation is given for a case that the HCD gas is used as the source gas, the $NH_3$ gas is used as the nitrogen-containing gas, the $O_2$ gas is used as the oxygen-containing gas, and the N₂ gas is used as the inert gas, to thereby form a silicon oxynitride film (SiON film) on the substrate as the insulating film. In this embodiment, the specific element corresponds to silicon, the specific element-containing layer corresponds to a silicon-containing layer, the nitride layer corresponds to a silicon nitride layer, the oxynitride layer corresponds to a silicon oxynitride layer, and the oxynitride film corresponds to the silicon oxynitride film.

When a plurality of wafers 200 are charged into the boat 217 (wafer charge), as shown in FIG. 1, the boat 217 supporting the plurality of wafers 200 is lifted by the boat elevator 115, and is loaded into the process chamber 201 (boat load). In this state, the seal cap 219 is in a state of sealing the lower end of the reaction tube 203 through the O-ring 220.

The inside of the process chamber 201 is vacuum-exhausted by the vacuum pump 246 so as to be set in a desired pressure (vacuum degree). At this time, the pressure in the process chamber 201 is measured by the pressure sensor 245, and based on the measured pressure information, the APC valve 244 is feedback-controlled (pressure adjustment). Further, the inside of the process chamber 201 is heated by the heater 207 so as to be set at a desired temperature. At this time, the power supply state to the heater 207 is feedback-controlled based on the temperature information detected by the temperature sensor 263 so as to have a desired temperature distribution (temperature adjustment). Subsequently, the wafer 200 is rotated by rotating the boat 217 by the rotation mechanism 267. Thereafter, the following three steps are sequentially executed.

[Step 1]

The valve 243a of the first gas supply tube 232a is opened, to flow the HCD gas to the first gas supply tube 232a. The HCD gas flows from the first gas supply tube 232a, and the flow rate is adjusted by the mass flow controller 241a. The HCD gas with the flow rate adjusted, is supplied into the process chamber 201 in a heated and depressurized state, from the gas supply holes 248a of the first nozzle 233a, and is exhausted through the exhaust tube 231 (supply of the HCD gas).

At this time, the valve 243d of the first inert gas supply tube 232d is opened, and the N₂ gas may be supplied through the inert gas supply tube 232d as the inert gas. The N₂ gas is supplied into the first gas supply tube 232a, with the flow rate adjusted by the mass flow controller 241d. The N₂ gas with the flow rate adjusted, is mixed into the HCD gas with the flow rate adjusted in the first gas supply tube 232a, and is supplied into the process chamber 201 in a heated and depressurized state, from the gas supply holes 248a of the first nozzle 233a, and is exhausted through the exhaust tube 231. At this time, in order to prevent an invasion of the HCD gas into the buffer chamber 237 and the second nozzle 233b, the valves 243e and 243f are opened, to thereby flow the N₂ gas into the second inert gas supply tube 232e and the third inert gas supply tube 232f. The N₂ gas is supplied into the process chamber 201 through the second gas supply tube 232b, the third gas supply tube 232c, the second nozzle 233b, and the buffer chamber 237, and is exhausted through the exhaust tube 231.

At this time, the APC valve is properly adjusted, to thereby maintain the pressure in the process chamber 201 to less than the atmospheric pressure, for example in a range of 10 to 1000 Pa. The supply flow rate of the HCD gas controlled by the mass flow controller 241a is set for example in a range of 10 to 1000 sccm (0.01 to 1 slm). The supply flow rate of the N₂ gas controlled by the mass flow controllers 241d, 241e, 241f, is set for example in a range of 100 to 2000 sccm (0.1 to 2 slm). The time required for exposing the HCD gas to the wafer 200, namely the supply time of the HCD gas is set for example in a range of 1 to 120 seconds. The temperature of the heater 207 is set so as to generate a CVD reaction in the process chamber 201 in the above-mentioned pressure zone. Namely, the temperature of the heater 207 is set so that the temperature of the wafer 200 is within a range of 350 to 700° C. for example. When the temperature of the wafer 200 is less than 350° C., HCD is hardly decomposed or adsorbed on the wafer 200. Further, when the temperature of the wafer 200 exceeds 700° C., the CVD reaction becomes strong, and deterioration in uniformity of the film thickness becomes remarkable. Therefore, the temperature of the wafer 200 is preferably set in a range of 350 to 700° C.

By supplying the HCD gas into the process chamber 201 under the above-mentioned condition, namely under a condition of generating the CVD reaction, the silicon-containing layer of about less than one atomic layer to several atomic layers for example, can be formed on the wafer 200 (an underlayer of its surface). The silicon-containing layer may be an adsorption layer of the HCD gas, or may be the silicon layer (Si layer), or may include both of them. Here, the silicon layer is a general name including a continuous layer made of silicon (Si), a discontinuous layer, and a silicon thin film formed by overlap of these layers. The continuous layer of Si is also called the silicon thin film in some cases. Si forming the silicon layer also includes a case that bond between Si and Cl is not completely cut. Further, the adsorption layer of the HCD gas also includes a continuous chemical adsorption layer and a discontinuous chemical adsorption layer, of gas molecules of the HCD gas. Namely, the adsorption layer of the HCD gas includes a chemical adsorption layer of one molecular layer or less than one molecular layer composed of HCD molecules. The HOD ($Si_2Cl_6$) molecules forming the adsorption layer of the HCD gas include a case that the bond between Si and Cl is partially cut ($Si_xCl_y$ molecule). Namely, the adsorption layer of HCD includes a continuous chemical adsorption layer and a discontinuous chemical adsorption layer of $Si_2Cl_6$ molecules and/or $Si_xCl_y$ molecules. The layer of less than one atomic layer means an atomic layer formed discontinuously, and the layer of one atomic layer means an atomic layer formed continuously. Further, the layer of less than one molecular layer means a molecular layer formed discontinuously, and the layer of one molecular layer means a molecular layer formed continuously. The silicon layer is formed by deposition of Si on the wafer 200 under a condition that the HCD gas is self-decomposed. The adsorption layer of the HCD gas is formed by adsorption of the HCD gas on the wafer 200 under a condition that the HCD gas is not self-decomposed. The film forming rate can be higher preferably in a case of forming the silicon layer on the wafer 200, than a case of forming the adsorption layer of the HCD gas on the wafer 200. When the thickness of the silicon-containing layer formed on the wafer 200 exceeds several atomic layers, an oxidizing action in step 3 described later, does not reach the whole body of the silicon-containing layer. Further, a minimum value of the silicon-containing layer that can be formed on the wafer 200, is less than one atomic layer. Therefore, the thickness of the silicon-containing layer is preferably set in a range of about less than one atomic layer to several atomic layers. By setting the thickness of the silicon-containing layer to one atomic layer or less, namely, to one atomic layer, or less than one atomic layer, actions such as nitriding in step 2 and oxidation in step 3 described layer can be relatively increased, and the time required for each step can be shortened. As a result, a processing time per one cycle can be shortened, and the processing time in total can be shortened. Namely, the film forming rate can also be increased. Further, by setting the thickness of the silicon-containing layer to one atomic layer or less, controllability of the uniformity of film thickness can also be improved.

As the source gas (silicon-containing gas), not only an inorganic source such as tetrachlorosilane namely silicon tetrachloride ($SiCl_4$, abbreviated as STC) gas, trichlorosilane ($SiHCl_3$, abbreviated as TCS) gas, dichlorosilane ($SiH_2Cl_2$, abbreviated as DCS) gas, monochlorosilane ($SiH_3Cl$, abbreviated as MCS) gas, monosilane ($SiH_4$) gas, etc., but also an organic source such as aminosilane-based tetrakisdimethyl aminosilane ($Si[N(CH_3)_2]_4$, abbreviated as 4DMAS) gas, tris (dimethylamino) silane ($Si[N(CH_3)_2]_3H$, abbreviated as 3DMAS) gas, bisdiethyl aminosilane ($Si[N(C_2H_5)_2]_2H_2$, abbreviated as 2DEAS) gas, bistertiary-butyl aminosilane ($SiH_2[NH(C_4H_9)]_2$, abbreviated as BTBAS) gas, may be used, other than the hexachlorodisilane ($Si_2Cl_6$, abbreviated as HCD) gas. As the inert gas, rare gases such as Ar gas, He gas, Ne gas, Xe gas, may be used other than the $N_2$ gas.

After the silicon-containing layer is formed on the wafer 200, the valve 243a of the first gas supply tube 232a is closed, to thereby stop the supply of the HCD gas. At this time, the inside of the process chamber 201 is vacuum-exhausted by the vacuum pump 246 while opening the APC valve 244 of the exhaust tube 231, to thereby remove the remained HCD gas from the process chamber 201. At this time, supply of the $N_2$ gas as the inert gas into the process chamber 201 is maintained while opening the valves 243d, 243e, and 243f. The $N_2$ gas functions as the purge gas, and thus, an effect of removing from the process chamber 201 the HCD gas unreacted and remained in the process chamber 201 or after contributing to forming the silicon-containing layer, can be further increased (removal of the remained gas).

The temperature of the heater 207 at this time, is set so that the temperature of the wafer is in a range of 350 to 700° C., similarly to the case of supplying the HCD gas. The supply flow rate of the $N_2$ gas as the purge gas supplied from each inert gas supply system, is set to be a flow rate in a range of 100 to 2000 sccm (0.1 to 2 slm) for example. As the purge gas, rare gases such as Ar gas, He gas, Ne gas, and Xe gas, etc., may be used other than the $N_2$ gas.

[Step 2]

After the remained gas in the process chamber 201 is removed, the valve 243b of the second gas supply tube 232b is opened, to flow the $NH_3$ gas to the second gas supply tube 232b. The $NH_3$ gas flows from the second gas supply tube 232b, with the flow rate adjusted by the mass flow controller 241b. The $NH_3$ gas with the flow rate adjusted, is supplied into the buffer chamber 237 in a heated and depressurized state, from the gas supply holes 248b of the second nozzle 233b. At this time, when the high frequency power is applied between the first rod electrode 269 and the second rod electrode 270, the $NH_3$ gas supplied into the buffer chamber 237, is activated by plasma. When the high frequency power is not applied between the first rod electrode 269 and the second rod electrode 270, the $NH_3$ gas supplied into the buffer chamber 237 is activated by heat. In this embodiment, by not applying the high frequency power between the first rod electrode 269 and the second rod electrode 270, the $NH_3$ gas supplied into the buffer chamber 237 is activated by heat. Thus, the $NH_3$ gas supplied into the buffer chamber 237 is activated by heat, and is supplied into the process chamber 201 in a heated and depressurized state from the gas supply holes 248c of the buffer chamber 237, and is exhausted from the exhaust tube 231 (supply of the $NH_3$ gas). The $NH_3$ gas can also be supplied by being activated by plasma. However, a soft reaction can be caused by activating the $NH_3$ gas by heat, and nitriding as described later can be softly performed.

At this time, the valve 243e of the second inert gas supply tube 232e is opened, and the $N_2$ gas may be supplied from the second inert gas supply tube 232e as the inert gas. The $N_2$ gas is supplied into the second gas supply tube 232b, with the flow rate adjusted by the mass flow controller 241e. The $N_2$ gas with the flow rate adjusted, is mixed into the $NH_3$ gas with the flow rate adjusted in the second gas supply tube 232b, and is supplied into the buffer chamber 237 in a heated and depressurized state from the gas supply holes 248b of the second nozzle 233b, and is supplied into the process chamber 201 in a heated and depressurized state from the gas supply holes 248c of the buffer chamber 237, and is exhausted from the exhaust tube 231. At this time, in order to prevent the invasion of the $NH_3$ gas into the first nozzle 233a and the third gas supply tube 232c, the valves 243d, 243f are opened, to thereby allow the $N_2$ gas to flow into the first inert gas supply tube 232d and the third inert gas supply tube 232f. The $N_2$ gas is supplied into the process chamber 201 through the first gas supply tube 232a, the third gas supply tube 232c, the first nozzle 233a, the second nozzle 233b, and the buffer chamber 237, and is exhausted from the exhaust tube 231.

At this time, the APC valve 244 is properly adjusted, to thereby maintain the pressure in the process chamber 201 in a pressure of less than the atmospheric pressure, for example in a range of 1 to 3000 Pa. The supply flow rate of the $NH_3$ gas controlled by the mass flow controller 241b, is set for example in a range of 10 to 10000 sccm (0.1 to 10 slm). The supply flow rate of the $N_2$ gas controlled by the mass flow controller 241e is set for example in a range of 100 to 10000 sccm (0.1 to 10 slm). The supply flow rate of the $N_2$ gas controlled by the mass flow controllers 241d, 241f is set for example in a range of 100 to 2000 sccm (0.1 to 2 slm). At this time, the partial pressure of the $NH_3$ gas in the process chamber 201 is set in a range of 6 to 2940 Pa. The time required for exposing the $NH_3$ gas to the wafer 200, namely the supply time of the $NH_3$ gas is set for example in a range of 1 to 120 seconds. The temperature of the heater 207 is set so that the temperature of the wafer 200 is in a similar temperature zone as the supply time of the HCD gas of step 1, namely set in a range of 350 to 700° C. In such a range of the temperature, it is confirmed that an effect of nitriding by the $NH_3$ gas under a depressurized atmosphere, namely a nitriding reaction of the silicon-containing layer can be obtained. It is also confirmed that if the temperature of the wafer 200 is excessively low, the nitriding effect cannot be obtained. Thus, the temperature of the heater 207 is preferably set so that the temperature in the process chamber 201 is maintained in a similar temperature zone in step 1 and step 2, in consideration of the throughput. Further, the temperature of the heater 207 is more preferably set so that the temperature in the process chamber 201 is maintained in a similar temperature zone in step 1 to step 3 (described later). In this case, the temperature of the heater 207 is set so that the temperature in the process chamber 201 is set in a range of 350 to 700° C. in step 1 to step 3 (described later).

By supplying the $NH_3$ gas into the process chamber 201 under the above-mentioned condition, the $NH_3$ gas is thermally activated or thermally decomposed by non-plasma under the heated and depressurized atmosphere, thus generating nitriding species containing nitrogen. At this time, since the HCD gas is not flowed into the process chamber 201, the $NH_3$ gas does not cause a vapor phase reaction, and the nitriding species obtained by thermal activation or the thermal decomposition of the $NH_3$ gas, is reacted with at least a part of the silicon-containing layer formed on the wafer 200 in step 1. Thus, nitriding treatment is performed to the silicon-containing layer, and by this nitriding treatment, the silicon-containing layer is changed (modified) to the silicon nitride layer ($Si_3N_4$ layer, simply called SiN layer).

At this time, preferably a nitriding reaction of the silicon-containing layer is performed so as not to be saturated. For example, when the silicon layer of several atomic layers is formed in step 1, a part or the whole part of its surface layer (one atomic layer on the surface) is nitrided. In this case, the nitriding treatment is performed under a condition that the nitriding reaction of the silicon layer is unsaturated so as not to allow the whole body of the silicon layer to be nitrided. Although several layers under a surface layer of the silicon layer can be nitrided depending on the condition, only the surface layer is preferably nitrided because controllability of the composition ratio of the silicon oxynitride film can be improved. Further, for example, when the silicon layer of one atomic layer or less than one atomic layer is formed in step 1, a part of its surface layer is nitrided. In this case as well, the nitriding treatment is performed under the condition that the nitriding reaction of the silicon layer is unsaturated so as not to allow the whole body of the silicon layer is nitrided.

In order to make the nitriding reaction of the silicon layer unsaturated, the above-mentioned processing condition is used as the processing condition of step 2. Further, by using the following processing condition as the processing condition of step 2, the nitriding reaction of the silicon-containing layer can be easily unsaturated.

Wafer temperature: 500 to 600° C.
Pressure in process chamber: 133 to 2666 Pa
Partial pressure of $NH_3$ gas: 67 to 2394 Pa
Supply flow rate of $NH_3$ gas: 1000 to 5000 sccm
Supply flow rate of $N_2$ gas: 300 to 1000 sccm
Supply flow time of $NH_3$ gas: 6 to 60 seconds At this time, as described above, the $NH_3$ gas can also be flowed by being activated by plasma. By thus activating the $NH_3$ gas by plasma and flowing the $NH_3$ gas thus activated, the nitriding species with further higher energy can be generated. By performing the nitriding treatment using such a nitriding species, an effect of improving device characteristics, etc., can be considered. When the $NH_3$ gas is activated by plasma, the $NH_3$ gas supplied into the buffer chamber 237 is plasma-excited by applying the high frequency power between the first rod electrode 269 and the second rod electrode 270 from the high frequency power source 273 via the impedance matching box 272, and is supplied into the process chamber 201 from the gas supply holes 248c as active species, and is exhausted from the exhaust tube 231. At this time, the high frequency power applied between the first rod electrode 269 and the second rod electrode 270 from the high frequency power source 273, is set for example in a range of 50 to 1000 W. The other processing conditions are the same as the above-mentioned processing conditions. In the above-mentioned temperature zone, the $NH_3$ gas is sufficiently activated by heat, and a sufficient amount of nitriding species are generated. Therefore, a sufficient nitriding power is obtained even if the $NH_3$ gas is thermally activated by non-plasma. As described above, a soft reaction can be caused by supplying the $NH_3$ gas in a thermally activated state, and the above-mentioned nitriding treatment can be softly performed.

Diazine ($N_2H_2$) gas, hydrazine ($N_2H_4$) gas, $N_3H_8$ gas, and amine-based gas, etc., may be used other than the ammonia ($NH_3$) gas, as the nitrogen-containing gas. Rare gases such as Ar gas, He gas, Ne gas, and Xe gas, etc., may be used other than the $N_2$ gas, as the inert gas.

After the silicon-containing layer is modified to the silicon nitride layer, the valve 243b of the second gas supply tube 232b is closed, to thereby stop the supply of the $NH_3$ gas. At this time, the inside of the process chamber 201 is vacuum-exhausted by the vacuum pump 246 while opening the APC valve 244 of the exhaust tube 231, to thereby remove the remained $NH_3$ gas and a reaction byproduct from the process chamber 201. At this time, supply of the $N_2$ gas into the process chamber 201 as the inert gas is maintained while opening the valves 243d, 243e, and 243f. The $N_2$ gas functions as the purge gas, thereby further improving the effect of removing the $NH_3$ gas and the reaction byproduct remained in the process chamber 201, unreacted or after contributing to the formation of the silicon nitride layer (removal of the remained gas).

Similarly to the case of supplying the $NH_3$ gas, the temperature of the heater 207 at this time is set so that the temperature of the wafer 200 is in a range of 350 to 700° C. The supply flow rate of the $N_2$ gas as the purge gas supplied from each inert gas supply system, is set for example in a range of 100 to 2000 sccm (0.1 to 2 slm) respectively. Rare gases such as Ar gas, He gas, Ne gas and Xe gas, etc., may be used other than the $N_2$ gas, as the purge gas.

[Step 3]

After the remained gas in the process chamber 201 is removed, the valve 243c of the third gas supply tube 232c, and the valve 243f of the third inert gas supply tube 232f are opened, to thereby flow the $O_2$ to the third gas supply tube 232c, and flow the $N_2$ gas to the third inert gas supply tube 232f as a diluting gas. The $N_2$ gas flows from the third inert gas supply tube 232f, with the flow rate adjusted by the mass flow controller 241f. The $O_2$ gas flows from the third gas supply tube 232c, with the flow rate adjusted by the mass flow controller 241c. The $O_2$ gas with the flow rate adjusted, is mixed into the $N_2$ gas with the flow rate adjusted in the third gas supply tube 232c, and is supplied into the buffer chamber 237 in the heated and depressurized state from the gas supply holes 248b of the second nozzle 233b. At this time, when the high frequency power is applied between the first rod electrode 269 and the second rod electrode 270, the $O_2$ gas supplied into the buffer chamber 237 is activated by plasma. When the high frequency power is not applied between the first rod electrode 269 and the second rod electrode 270, the $O_2$ gas supplied into the buffer chamber 237 is thermally activated. In this embodiment, by not applying the high frequency power between the first rod electrode 269 and the second rod electrode 270, the $O_2$ gas supplied into the buffer chamber 237 is thermally activated. Thus, the $O_2$ gas supplied into the buffer chamber 237 is thermally activated and is supplied into the process chamber 201 in the heated and depressurized state together with the $N_2$ gas from the gas supply holes 248c of the buffer chamber 237, and is exhausted from the exhaust tube 231 (supply of the $O_2$ gas and $N_2$ gas). Although the $O_2$ gas can be activated by plasma and supplied, a soft reaction can be caused by supplying the $O_2$ gas in a thermally activated state, and oxidation described later can be softly performed.

At this time, in order to prevent the invasion of the $O_2$ gas into the first nozzle 233a or to the upstream side of the second gas supply tube 232b, the valves 243d and 243e are opened, to thereby flow the $N_2$ gas into the first inert gas supply tube 232d and the second inert gas supply tube 232e. The $N_2$ gas is supplied into the process chamber 201 through the first gas supply tube 232a, the second gas supply tube 232b, the first nozzle 233a, the second nozzle 233b, and the buffer chamber 237, and is exhausted from the exhaust tube 231.

At this time, the APC valve 244 is properly adjusted, to thereby maintain the pressure in the process chamber 201, to less than the atmospheric pressure, for example in a range of 1 to 15000 Pa. The supply flow rate of the $O_2$ gas controlled by the mass flow controller 241c is set for example in a range of 100 to 20000 sccm (0.1 to 20 slm). The supply flow rate of the N₂ gas controlled by the mass flow controller 241f is set for example in a range of 100 to 20000 sccm (0.1 to 20 slm). The supply flow rate of the N₂ gas controlled by the mass flow controllers 241d, 241e is set for example in a range of 100 to 2000 sccm (0.1 to 2 slm). At this time, the partial pressure of the O₂ gas in the process chamber 201 is set in a range of 0.5 to 2940 Pa. The time required for exposing the O₂ gas to the wafer 200, namely the supply time of the O₂ gas is set for example in a range of 1 to 120 seconds. The temperature of the heater 207 is set so that the temperature of the wafer 200 is in a similar temperature zone as the case of supplying the HCD gas in step 1, namely set in a range of 350 to 700° C. In such a range of the temperature, it is confirmed that the effect of oxidation by the O₂ gas under the depressurized atmosphere, namely the oxidizing reaction of the silicon nitride layer can be obtained. It is also found that if the temperature of the wafer 200 is excessively low, the effect of the oxidation cannot be obtained. As described above, the temperature of the heater 207 is preferably set so that the temperature in the process chamber 201 is set in the similar temperature zone, namely set to a specific temperature in a range of 350 to 700° C. in step 1 to step 3, in consideration of the throughput.

By supplying the O₂ gas into the process chamber 201 under the above-mentioned condition, the O₂ gas is thermally activated by non-plasma under the heated and depressurized atmosphere. At this time, neither the HCD gas nor the NH₃ gas is flowed into the process chamber 201, and therefore the O₂ gas does not cause the vapor phase reaction, and the thermally activated O₂ gas is reacted with at least a part of the silicon nitride layer formed on the wafer 200 in step 2. Thus, the oxidizing treatment is performed to the silicon nitride layer, and by this oxidizing treatment, the silicon nitride layer is changed to the silicon oxynitride layer (simply called SiON layer hereafter) (modified).

At this time, it is preferable not to allow the oxidizing reaction of the silicon nitride layer to be saturated. For example when the silicon nitride layer of several atomic layers is formed in step 2, a part or the whole part of its surface layer (one atomic layer on the surface) is oxidized. In this case, oxidation is performed under a condition that the oxidizing reaction of the silicon nitride layer is unsaturated so as not to oxidize the whole body of the silicon nitride layer. Although several layers under a surface layer of the silicon nitride layer can be oxidized depending on the condition, only the surface layer is preferably oxidized because controllability of the composition ratio of the silicon oxynitride film can be improved. Further, for example, when the silicon nitride layer of one atomic layer or less than one atomic layer is formed in step 2, a part of its surface layer is oxidized. In this case as well, the oxidizing treatment is performed under the condition that the oxidizing reaction of the silicon nitride layer is unsaturated so as not to allow the whole body of the silicon nitride layer to be oxidized.

In order to make the oxidizing reaction of the silicon nitride layer unsaturated, the above-mentioned processing condition is used as the processing condition of step 3. However, by using the following processing condition as the processing condition of step 3, the oxidizing reaction of the silicon-containing layer can be easily unsaturated.
Wafer temperature: 500 to 600° C.
Pressure in process chamber: 10 to 2666 Pa
Partial pressure of O₂ gas: 0.5 to 1333 Pa
Supply flow rate of O₂ gas: 1000 to 5000 sccm
Supply flow rate of N₂ gas: 300 to 1000 sccm
Supply time of O₂ gas: 6 to 60 seconds At this time, by controlling the partial pressure of the O₂ gas in the process chamber 201, the composition ratio of the silicon oxynitride layer is controlled, to thereby control the composition ratio of the silicon oxynitride film having a specific film thickness which is formed finally. The control of the composition ratio of the silicon oxynitride film will be described later.

At this time, as described above, the O₂ gas can be activated by plasma and the activated O₂ gas may be flowed. By flowing the O₂ gas in an activated state by plasma, oxidizing species with further hither energy can be generated, and by performing the oxidizing treatment using the oxidizing species, it can be considered that the effect of improving the device characteristic is obtained. When the O₂ gas is activated by plasma, the gas supplied into the buffer chamber 237 is plasma-excited by applying the high frequency power between the first rod electrode 269 and the second rod electrode 270 from the high frequency power source 273 via the impedance matching box 272. Then, the O₂ gas thus plasma-excited is supplied into the process chamber 201 from the gas supply holes 248c together with the N₂ gas as active species, and is exhausted from the exhaust tube 231. At this time, the high frequency power applied between the first rod electrode 269 and the second rod electrode 270 from the high frequency power source 273, is set for example in a range of 50 to 1000 W. The other processing conditions are the same as the above-mentioned processing conditions. However, in this case, the oxidizing treatment is required to be performed while suppressing the oxidizing power by the oxidizing species including active species as much as possible. This is because the oxidizing power of the oxidizing species including the active species is extremely strong, and therefore when the active species is used, the silicon nitride layer is changed not to the silicon oxynitride layer but to the silicon oxide layer unless an amount of the active species given to the silicon nitride layer formed on the wafer 200 is suppressed as much as possible. In order to make the silicon nitride layer change to the silicon oxynitride layer, the processing condition such as suppressing the oxidizing power of the oxide species including the active species as much as possible, is required to be used.

In the above-mentioned temperature zone, the O₂ gas is thermally activated sufficiently in the above-mentioned temperature zone, and a sufficient amount of oxidizing species is generated. Therefore, a sufficient oxidizing power can also be obtained even by thermally activating the O₂ gas by non-plasma. As described above, by thermally activating the O₂ gas and supplying the activated O₂ gas, a soft reaction can be caused and the above-mentioned oxidizing treatment can be softly performed. Also, by using the thermally activated O₂ gas, the controllability of controlling the composition ratio of the silicon oxynitride film can be preferably improved. For these reasons, the O₂ gas thermally activated and flowed in this embodiment.

Ozone (O₃) gas, steam (H₂O) gas, hydrogen peroxide H₂O₂) gas, nitric monoxide (NO) gas, nitrous oxide (N₂O) gas, nitrogen dioxide (NO₂) gas, carbon monoxide (CO) gas, and carbon dioxide (CO₂) gas, etc., may be used other than the oxygen (O₂) gas, as the oxygen-containing gas. Rare gases such as Ar gas, He gas, Ne gas, and Xe gas, etc., may be used other than the N₂ gas, as the inert gas.

After the silicon nitride layer is modified to the silicon oxynitride layer, the valve 243c of the third gas supply tube 232c is closed, to thereby stop the supply of the O₂ gas. At this time, the inside of the process chamber 201 is vacuum-exhausted by the vacuum pump 246 while opening the APC valve 244 of the exhaust tube 231, to thereby remove the remained O₂ gas and a reaction byproduct from the process chamber 201. At this time, the supply of the $N_2$ gas as the inert gas into the process chamber 201 is maintained, while opening the valves 243d, 243e, and 243f. The $N_2$ gas functions as the purge gas, and thus, an effect of removing from the process chamber 201 the $O_2$ gas and the reaction byproduct unreacted and remained in the process chamber 201 or after contributing to forming the silicon oxynitride layer, can be further increased (removal of the remained gas).

The temperature of the heater 207 is set so that the temperature of the wafer 200 is in a range of 350 to 700° C. similarly to the case of supplying the $O_2$ gas. The supply flow rate of the $N_2$ gas as the purge gas supplied from each inert gas supply system, is set to be a flow rate in a range of 100 to 2000 sccm (0.1 to 2 slm) for example. As the purge gas, rare gases such as Ar gas, He gas, Ne gas, and Xe gas, etc., may be used other than the $N_2$ gas.

The above-mentioned steps 1 to 3 are set as one cycle, and by executing this cycle a specific number of times, preferably multiple numbers of times, the silicon oxynitride film (simply called SiON film hereafter) having the specific film thickness can be formed on the wafer 200.

When the silicon oxynitride film having the specific film thickness is formed, the valves 243d, 243e, and 243f are opened, to thereby supply the $N_2$ gas as the inert gas into the process chamber 201 through each of the first inert gas supply tube 232d, the second inert gas supply tube 232e, and the third inert gas supply tube 232f, and is exhausted from the exhaust tube 231. The $N_2$ gas functions as the purge gas, and thus, the inside of the process chamber 201 is purged by the inert gas, and the gas and the reaction byproduct remained in the process chamber 201 are removed from the process chamber 201 (Purge). Thereafter, the atmosphere in the process chamber 201 is replaced by the inert gas, and the pressure in the process chamber 201 is returned to a normal pressure (return to the atmospheric pressure).

Thereafter, the seal cap 219 is descended by the boat elevator 115, and the lower end of the reaction tube 203 is opened, and the processed wafer 200 is unloaded to outside of the reaction tube 203 from the lower end of the reaction tube 203 in a state of being held by the boat 217. Thereafter, the processed wafer 200 is discharged from the boat 217 (wafer discharge).

In step 3 of this embodiment, by performing the step of changing the silicon nitride layer to the silicon oxynitride layer using the activated $O_2$ gas, Si—N, Si—Cl, and Si—H bond contained in the silicon nitride layer are partially cut-off by an energy of the activated $O_2$ gas. The energy for forming the Si—O bond is higher than a bonding energy of Si—N, Si—Cl, and Si—H, and therefore by giving the energy required for forming the Si—O bond, to the silicon nitride layer to which the oxidizing treatment is applied, Si—N, Si—Cl, and Si—H bonds in the silicon nitride layer are partially cut-off. N, H, Cl cut-off from the bond with Si, are removed from the layer, and are discharged as $N_2$, $H_2$, $Cl_2$, HCl, etc. Further, extra atomic bonding of Si after cut-off from N, H, Cl, is bonded to O included in the activated $O_2$ gas. Thus, the silicon nitride layer is changed (modified) to the silicon oxynitride layer. It is confirmed that the silicon oxynitride layer thus formed, is a good quality film with extremely low hydrogen and chloride concentration in the film.

Further, in step 3 of this embodiment, by controlling the partial pressure of the $O_2$ gas as the oxygen-containing gas in the process chamber 201, the composition ratio of the silicon oxynitride layer formed in step 3 is controlled, and the composition ratio of the silicon oxynitride film having the specific film thickness formed finally, particularly the ratio of an oxygen component and a nitrogen component, namely O/N ratio (ratio of the O-component to the N-component) is controlled. Thus, the composition ratio of the silicon oxynitride film can be controlled with good controllability, without decreasing the film forming rate. According to a technique of this embodiment, it is confirmed that the silicon oxynitride film with uniform composition ratio, particularly uniform O/N ratio in a depth direction (film thickness direction) and in a plane of the wafer, and with excellent film thickness uniformity in the wafer plane, can be formed. Further, according to the technique of this embodiment, it is confirmed that by controlling the composition ratio of the silicon oxynitride film, RI of the silicon oxynitride film can be controlled in a range of 1.45 to 2.0. Further, according to this embodiment, it is confirmed that by controlling the composition ratio of the silicon oxynitride film, WER of the silicon oxynitride film can be controlled in a range of 1.5 to 20 nm/min. The control of the composition ratio of the silicon oxynitride film will be described hereafter in detail, using examples.

EXAMPLES

Example 1

It is found by the inventors of the present invention, that by controlling the supply time of the $O_2$ gas in step 3 of the above-mentioned embodiment, the composition ratio of the SiON film can be controlled. It is also found that WER characteristics and RI of the SiON film can be thereby controlled.

Figure 4:
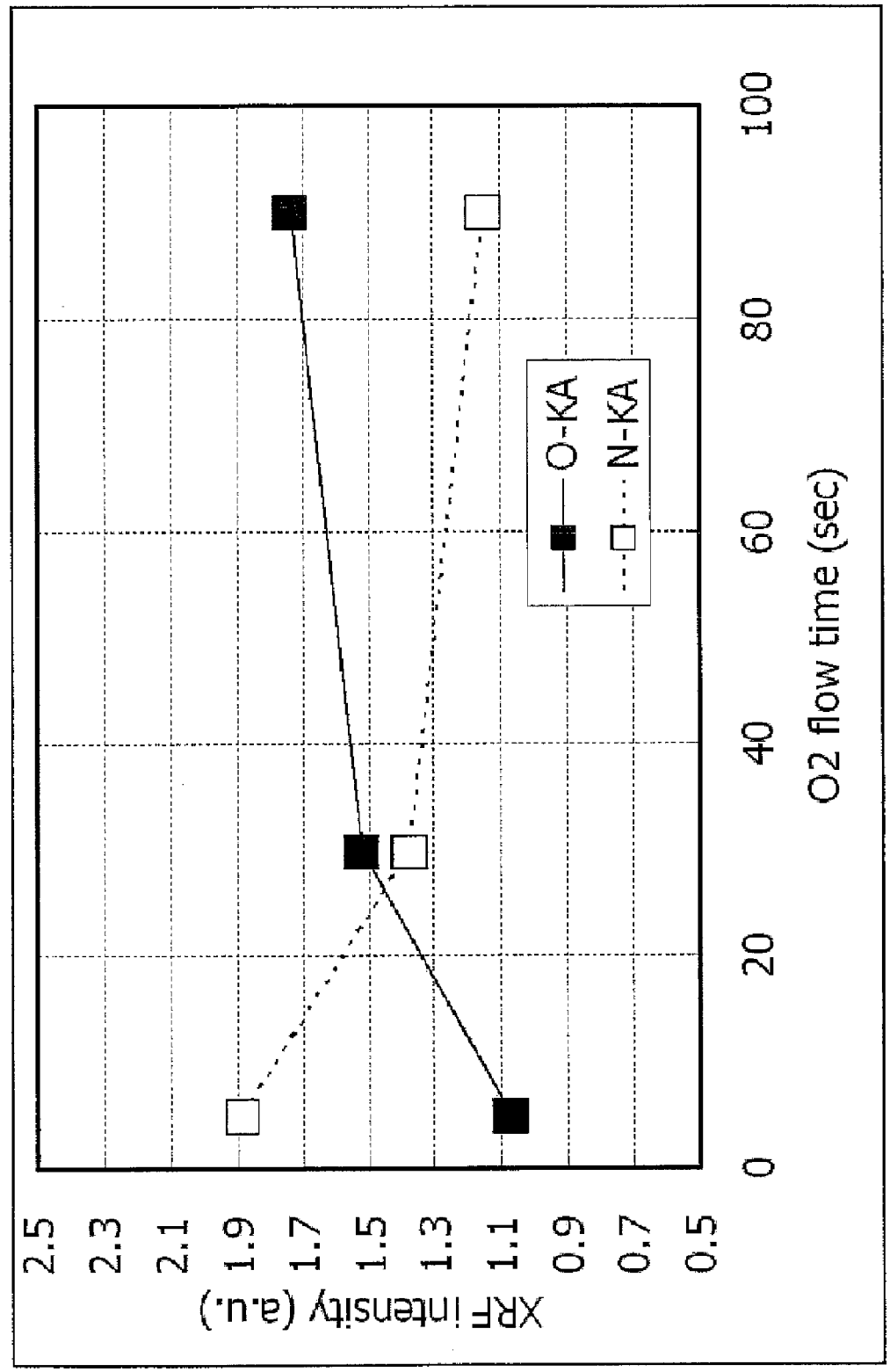
FIG. 4 is a view showing a relation between a supply time of an $O_2$ gas in step 3 of the film formation sequence of this embodiment, and detection intensity of oxygen (O) and nitrogen (N) in a SiON film by X-ray Fluorescence Analysis (XRF).
Figure 5:
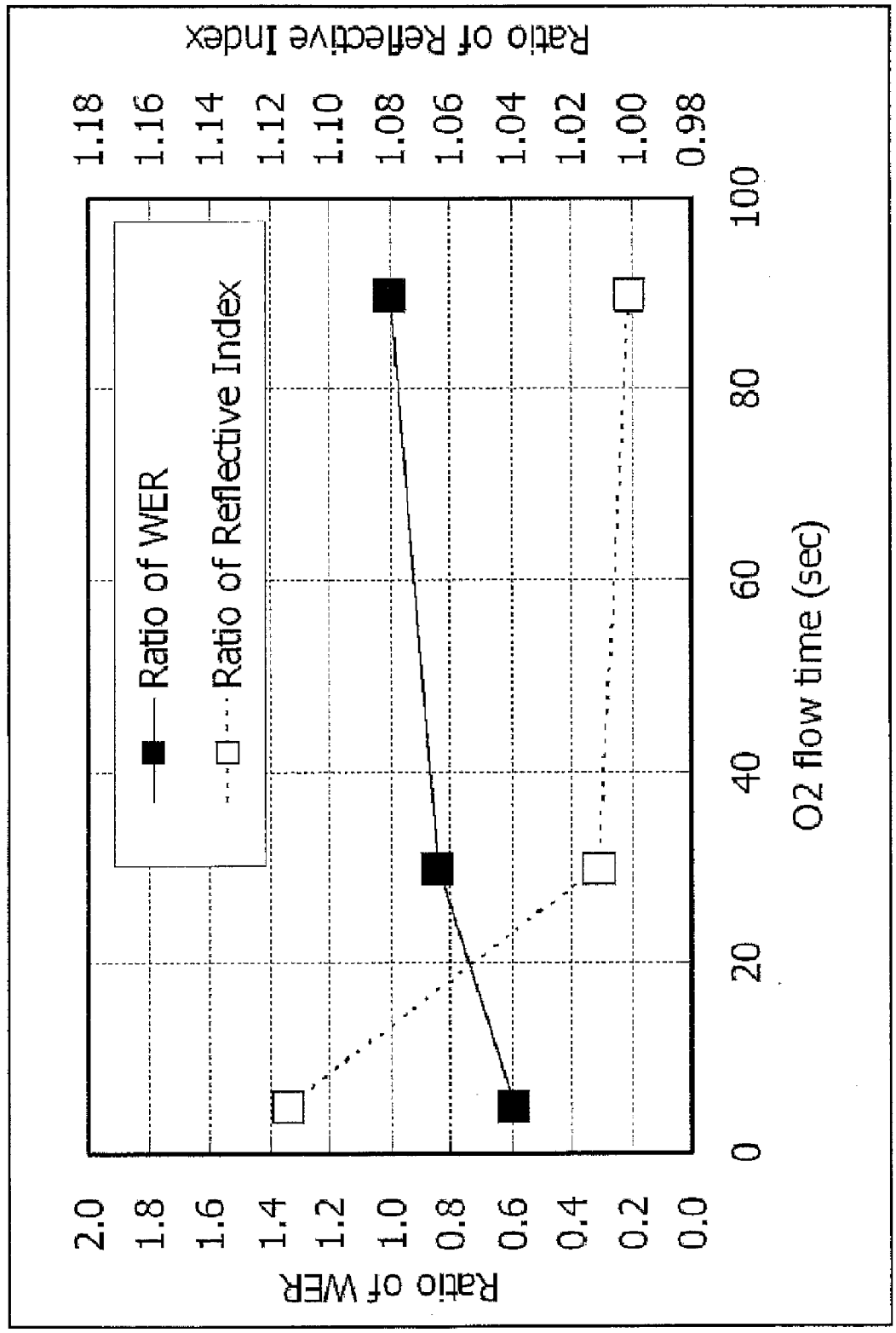
FIG. 5 is a view showing a relation between a supply time of the $O_2$ gas in step 3 of the film formation sequence of this embodiment, and WER and RI of the SiON film.

FIG. 4 shows a relation between the supply time of the $O_2$ gas in step 3, and a detection intensity of oxygen (O) and nitrogen (N) in the SiON film by X-ray Fluorescence Analysis (XRF). Further, FIG. 5 shows a relation between the supply time of the $O_2$ gas in step 3, and WER and RI of the SiON film. The detection intensity (arbitrary unit (a.u.)) of O and N in the SiON film is taken on the vertical axis of FIG. 4. WER of the SiON film is taken on the vertical axis at the left side, and RI of the SiON film is taken on the vertical axis at the right side in FIG. 5. In FIG. 5, WER and RI are expressed by a ratio, with a certain value (values of WER and RI when the supply time of the $O_2$ gas is 90 seconds) as a reference. Further, in each view, the horizontal axis indicates the supply time of the $O_2$ gas. The SiON film as an evaluation sample was formed under a condition in a range of the processing condition described in the above-mentioned embodiment based on the film formation sequence of the above-mentioned embodiment. Further, the supply time of the $O_2$ gas was varied between 5 to 9 seconds, and a plurality of evaluation samples were prepared.

Figure 6:
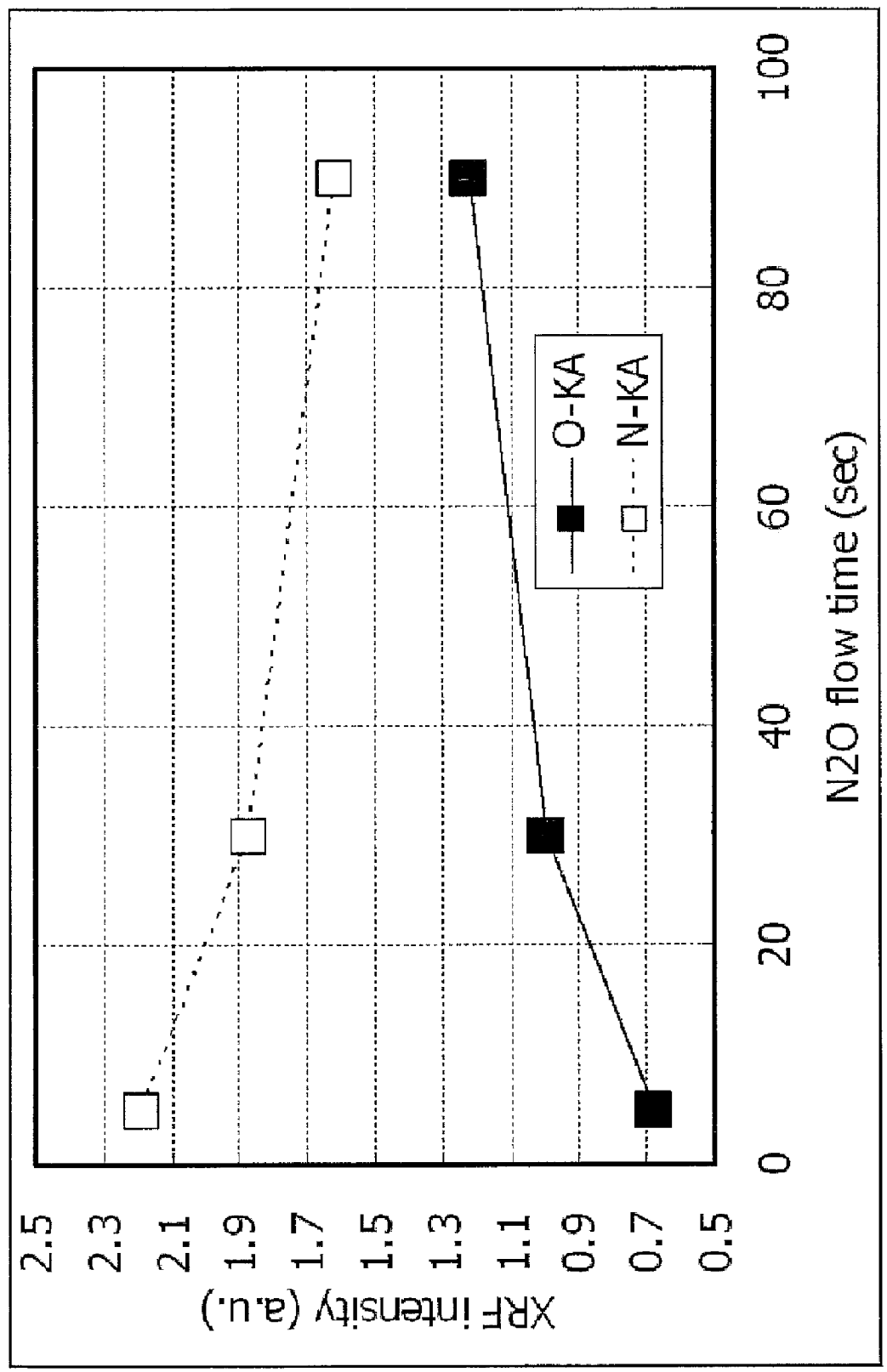
FIG. 6 is a view showing a relation between a supply time of a $N_2O$ gas in step 3 of the film formation sequence of this embodiment, and the detection intensity of oxygen (O) and nitrogen (N) in the SiON film by X-ray Fluorescence Analysis (XRF).
Figure 7:
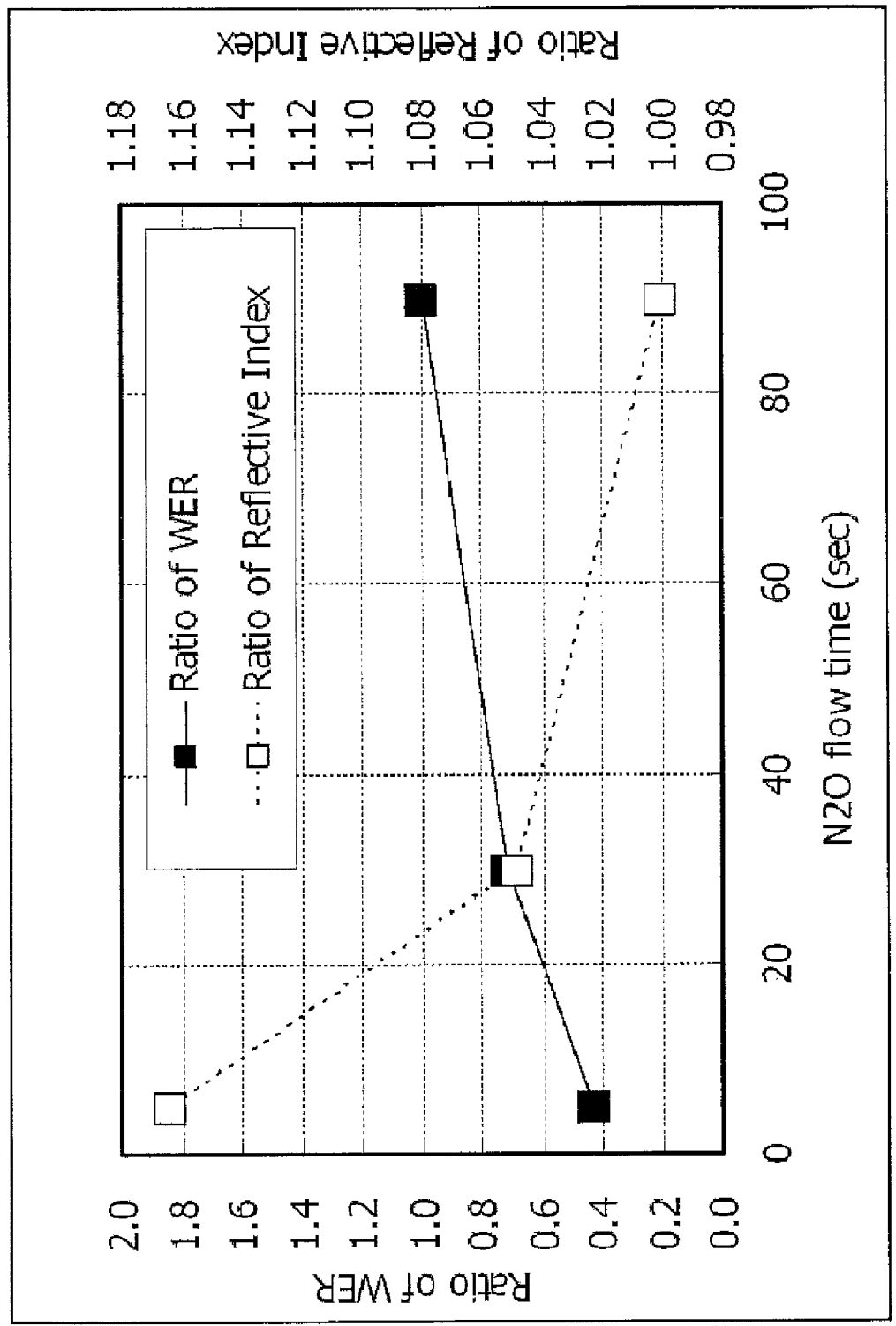
FIG. 7 is a view showing a relation between a supply time of the $N_2O$ gas in step 3 of the film formation sequence of this embodiment, and WER and RI of the SiON film.

From FIG. 4, it is found that by controlling the supply time of the $O_2$ gas, O-concentration and N-concentration in the SiON film, namely, the composition ratio of the SiON film can be controlled. Further, from FIG. 5, it is found that by controlling the supply time of the $O_2$ gas, WER and RI can be controlled. FIG. 6 and FIG. 7 show a result of performing a similar evaluation using a $N_2O$ gas instead of the $O_2$ gas as the oxygen-containing gas, and it is found that a similar tendency as a case of using the $O_2$ gas, can be obtained.

From these results, it is found that by controlling the supply time of the oxygen-containing gas, the O-concentration and the N-concentration in the SiON film can be controlled, and as a result, the WER characteristic and RI can be controlled.

However, for example when the value of RI is set to be low and WER is set to be high, the supply time of the oxygen-containing gas is required to be prolonged, thus causing the film forming rate to be low.

Example 2

Therefore, as a strenuous effort by the inventors of the present invention, it is found that by controlling not the supply time of the oxygen-containing gas but controlling the partial pressure of the oxygen-containing gas in the process chamber, the composition ratio of the SiON film can be controlled without lowering the film forming rate, namely, without prolonging the supply time of the oxygen-containing gas. Thus, it is also found that the WER characteristic and RI of the SiON film can be controlled. The control of the partial pressure of the oxygen-containing gas is performed for example by controlling a diluting amount using a diluting $N_2$ gas of the oxygen-containing gas, namely, controlling the supply flow rate of the diluting $N_2$ gas, while controlling the pressure in the process chamber to a specific pressure, based on the formula 3, by a partial pressure control system in the substrate processing apparatus of the above-mentioned embodiment.

Figure 8:
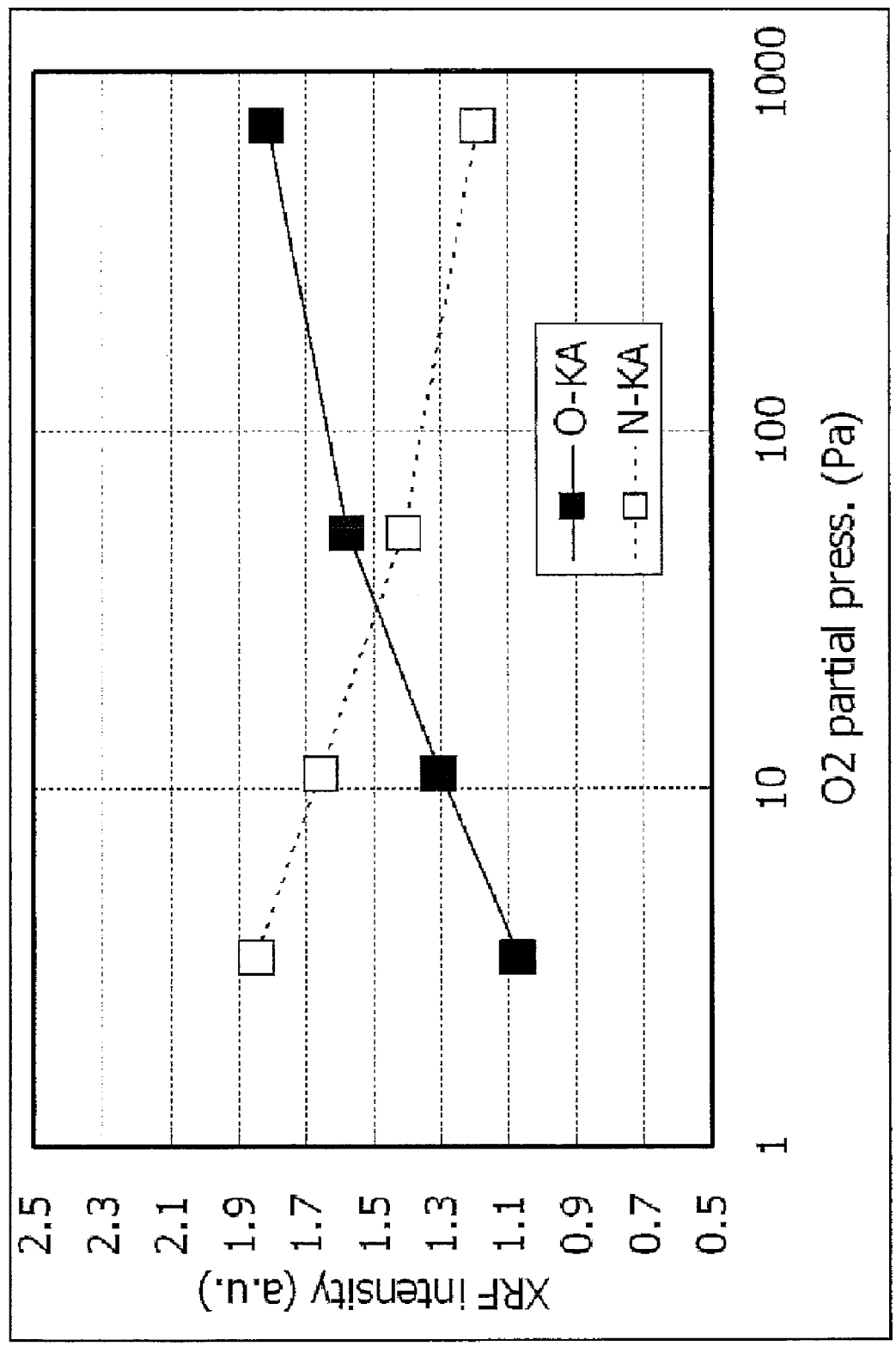
FIG. 8 is a view showing a relation between a partial pressure of an $O_2$ gas in a process chamber in step 3 of the film formation sequence of this embodiment, and the detection intensity of oxygen (O) and nitrogen (N) in the SiON film.
Figure 9:
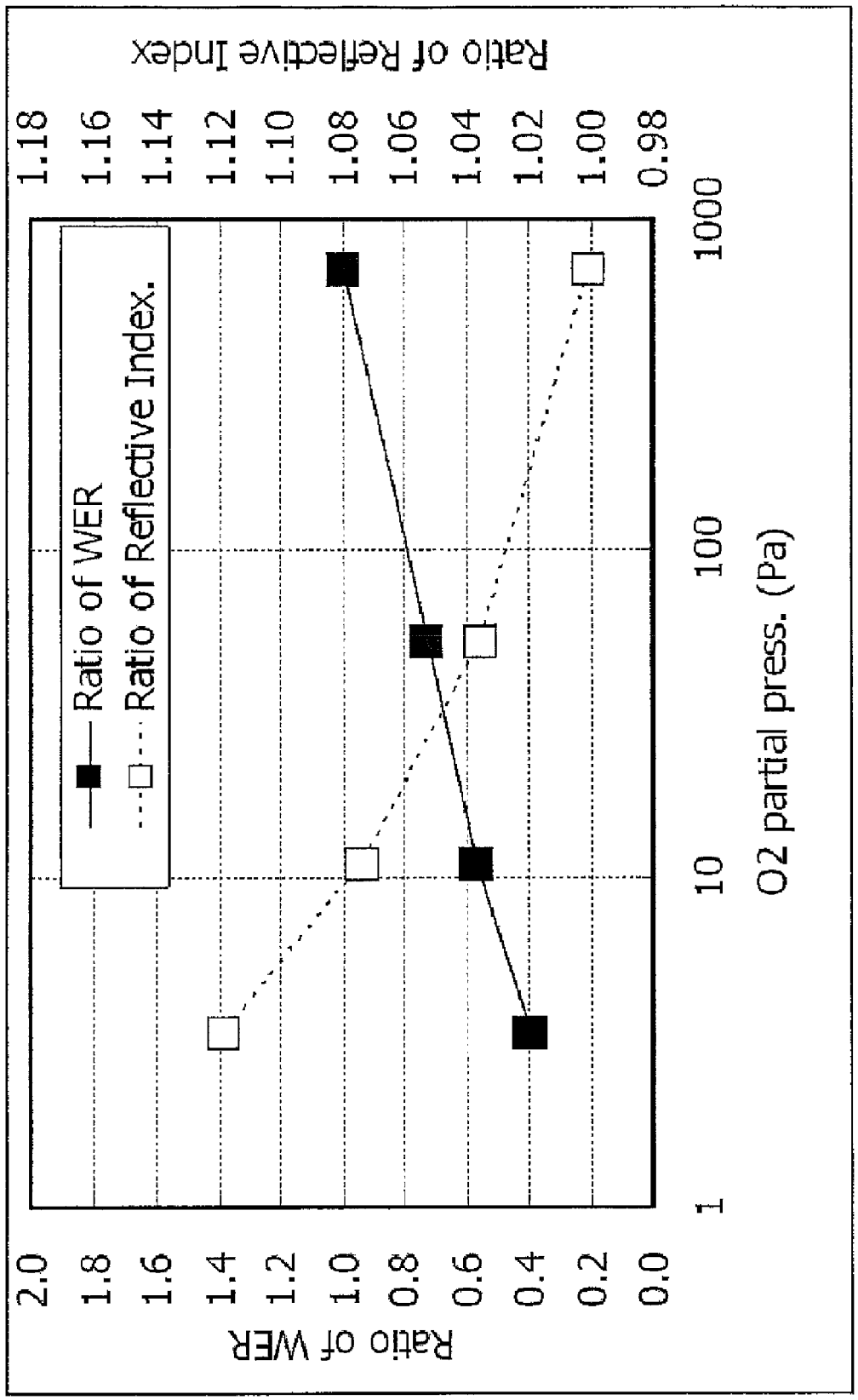
FIG. 9 is a view showing a relation between the partial pressure of the $O_2$ gas in the process chamber in step 3 of the film formation sequence of this embodiment, and WER and RI of the SiON film.

FIG. 8 shows a relation between the partial pressure of the $O_2$ gas in the process chamber in step 3, and the detection intensity of oxygen (O) and nitrogen (N) in the SiON film by X-ray Fluorescence Analysis (XRF). Further, FIG. 9 shows a relation between the partial pressure of the $O_2$ gas in the process chamber in step 3, and WER and RI of the SiON film. The detection intensity (arbitrary unit (a.u.)) of O and N in the SiON film is taken on the vertical axis in FIG. 8. WER of the SiON film is taken on the vertical axis at the left side, and RI of the SiON film is taken on the vertical axis at the right side of FIG. 9. In FIG. 9, WER and RI are expressed by a ratio, with a certain value (values of WER and RI when the partial pressure of the $O_2$ gas is 713 Pa) as a reference. In each view, the horizontal axis indicates the partial pressure (Pa) of the $O_2$ gas. The SiON film as an evaluation sample was formed under a condition in a range of the processing condition described in the above-mentioned embodiment by the film formation sequence of the above-mentioned embodiment. Further, the partial pressure of the $O_2$ gas was varied between 3.4 to 713 Pa, and a plurality of evaluation samples were prepared.

From FIG. 8, it is found that by controlling the partial pressure of the $O_2$ gas, the O-concentration and the N-concentration in the SiON film, namely, the composition ratio of the SiON film can be accurately controlled. Further, from FIG. 9, it is found that by controlling the partial pressure of the $O_2$ gas, WER and RI can be accurately controlled. In these evaluations, it is also confirmed that the composition ratio of the SiON film, particularly the O/N ratio can be controlled without lowering the film forming rate, namely, without prolonging the supply time of the $O_2$ gas. It is also confirmed that the controllability in the control of the composition ratio of the SiON film can be improved.

From these results, it is found that by controlling the partial pressure of the oxygen-containing gas, the O-concentration and the N-concentration in the SiON film can be controlled without lowering the film forming rate, namely, without prolonging the supply time of the oxygen-containing gas, and as a result, WER characteristic and RI can be controlled. It is also found that according to this film forming technique, RI of the SiON film can be accurately controlled in a range of 1.45 to 2.0, and WER can be accurately controlled in a range of 1.5 to 20 nm/min.

Incidentally, as an advantage of controlling the composition ratio of the SiON film by controlling the partial pressure of the $O_2$ gas in the process chamber, the following advantage can be given, other than the above-mentioned advantage.

Namely, generally, there is a limit in an exhaust power of an apparatus, and as a supply amount of a gas is increased, a controllable lower limit pressure range becomes narrower. In this case, when 1 slm of the $O_2$ gas is supplied without being diluted, and an in-furnace pressure is a controllable pressure lower limit of 10 Pa (for example, when the APC valve is set in a full-open state), the partial pressure of the $O_2$ gas is 10 Pa, and cannot be a lower pressure than 10 Pa. Therefore, in this case, WER of the SiON film cannot be lower than the WER of the SiON film obtained at this time, and RI of the SiON film cannot be higher than the RI of the SiON film obtained at this time.

As one of the techniques to cope with this situation, it can be considered that the supply time of the $O_2$ gas is shortened. However, if the supply time of the $O_2$ gas is excessively shortened, the time is required for stabilizing the pressure in the process chamber from start of supplying the gas. Therefore, there is a variation in the control of the pressure in each cycle performed a specific number of times, and as a result, the variation in uniformity of the film thickness and the composition in a film thickness direction, and a variation in the film thickness and the composition between processing times, become large, and this is not preferable.

Further, as a technique of lowering the pressure in the process chamber, it can be considered that the supply amount of the gas is reduced. However, when the gas is supplied through a multiple hole-type nozzle as described in the above-mentioned embodiment, the flow rate of a minimum limit (for example, 1 slm) is required for uniformly spraying the gas from the upper part to the lower part, and a lower limit control pressure is determined from a relation between the flow rate and the exhaust power.

As described above, when the composition ratio of the SiON film is controlled by the supply time of the $O_2$ gas, the film forming rate is changed. Further, there is a limit in the control pressure depending on a nozzle shape of an apparatus, and the exhaust power. Therefore there is also a limit in the control of the composition ratio, thus making it impossible to form the SiON film with higher WER or lower RI.

Meanwhile, according to the above-mentioned embodiment, for example, by diluting the $O_2$ gas by the $N_2$ gas, and setting its total flow rate to not less than a limit value of the apparatus, namely, by setting its total flow rate to a flow rate of a minimum requirement for uniformly spraying the gas from the upper part to the lower part when the gas is supplied through the multiple-hole nozzle, the partial pressure of the $O_2$ gas can be controlled in a wider range, and the control of the composition ratio can be performed in a wider range, and the composition ratio of the SiON film can be controlled with good controllability.

In the above-mentioned embodiment and example, explanation is given for a case that the oxygen-containing gas (oxide gas) and the inert gas (diluting gas) are supplied into the process chamber. However, a hydrogen-containing gas (reducing gas) such as a hydrogen ($H_2$) gas and an ammonia ($NH_3$) gas may also be added into the oxygen-containing gas. Namely, in step 3, the oxygen-containing gas, the hydrogen-containing gas, and the inert gas may be supplied into the process chamber. By adding the hydrogen-containing gas into the oxygen-containing gas under the processing condition of the above-mentioned embodiment (under the heated and depressurized atmosphere), an effect of considerable improvement of the oxidizing power can be obtained, compared with a case of supplying the oxygen-containing gas alone. Thus, when the hydrogen-containing gas is added into the oxygen-containing gas, the oxidizing power can be improved, thus facilitating the control of increasing the oxygen concentration in the SiON film. For example, in this case, the $SiO_2$ film containing a slight amount of nitrogen (N) with RI of about 1.5, namely, the SiON film having extremely low nitrogen-content can be formed. In this case, when the flow rate of the $O_2$ gas as the oxygen-containing gas is indicated by Qo, the flow rate of the $H_2$ gas as the hydrogen-containing gas is indicated by Qr, and the flow rate of the diluting $N_2$ gas is indicated by Qd, and the pressure in the process chamber (total pressure) is indicated by V, the partial pressure Vo of the O₂ gas is expressed by the following formula.

$$Vo = [Qo/(Qo+Qr+Qd)] \times V \quad \text{(Formula 4)}$$

Namely, by controlling the total pressure V in the process chamber 201, the flow rate Qo of the O₂ gas, the flow rate Qr of the H₂ gas, and the flow rate Qd of the diluting N₂ gas based on formula 4, the partial pressure Vo of the O₂ gas in the process chamber 201 can be controlled. The control of the partial pressure can be performed by the above-mentioned partial pressure control system.

Further, in the above-mentioned embodiment and example, explanation is given for a case that step 1, step 2, step 3 are sequentially performed. However, step 2 and step 3 can also be performed simultaneously. By simultaneously performing step 2 and step 3, the SiON film having smaller N-concentration than the N-concentration of the SiON film formed by the film formation sequence of the above-mentioned embodiment, can be formed. In this case, the oxygen-containing gas, the nitrogen-containing gas, and the inert gas (diluting gas) are simultaneously supplied into the process chamber in step 2. Namely, in this case, by supplying the source gas (HCD gas) containing a specific element into the processing vessel in which the substrate is housed, the oxynitride film having the specific film thickness is formed on the substrate by performing multiple numbers of times a cycle of forming a specific element-containing layer on the substrate, and changing the specific element-containing layer to an oxynitride layer by supplying the nitrogen-containing gas (NH₃ gas), the oxygen-containing gas (O₂ gas), and the inert gas (N₂ gas) into the processing vessel, with this sequence as one cycle. Then, by controlling the partial pressure of the oxygen-containing gas in the processing vessel in changing the specific element-containing layer to the oxynitride layer, the composition of the oxynitride film having the specific film thickness is controlled. In this case, when the flow rate of the O₂ gas as the oxygen-containing gas is indicated by Qo, the flow rate of the NH₃ gas as the nitrogen-containing gas is indicated by Qn, the flow rate of the diluting N₂ gas is indicated by Qd, and the pressure (total pressure) in the process chamber is indicated by V, the partial pressure Vo of the O₂ gas is expressed by the following formula.

$$Vo = [Qo/(Qo+Qn+Qd)] \times V \quad \text{(Formula 5)}$$

Namely, by controlling the total pressure V in the process chamber 201, and the flow rate Qo of the O₂ gas, the flow rate Qn of the NH₃ gas, and the flow rate Qd of the diluting N₂ gas based on the formula 5, the partial pressure Vo of the O₂ gas in the process chamber 201 can be controlled. The partial pressure can be controlled by the above-mentioned partial pressure control system.

Further, in the above-mentioned embodiment and example, explanation is given for a case that the silicon oxynitride film (SiON film) containing silicon (Si) being a semiconductor element, is formed on the substrate as the oxynitride layer. However, the present invention can also be applied to a case of forming on the substrate, a metal oxynitride film containing metal elements such as zirconium (Zr), hafnium (Hf), titanium (Ti), tantalum (Ta), aluminum (Al), etc., as the oxynitride film, namely, a case of forming a zirconium oxynitride film (ZrON film), a hafnium oxynitride film (HfON film), a titanium oxynitride film (TiON film), a tantalum oxynitride film (TaON film), and an aluminum oxynitride film (AlON film), etc.

In this case, by performing multiple numbers of times a cycle of forming a metal element-containing layer on a substrate by supplying a source gas containing a metal element into a processing vessel in which the substrate is housed (step 1), changing the metal element-containing layer to a metal nitride layer by supplying a nitrogen-containing gas into the processing vessel (step 2), and changing the metal nitride layer to a metal oxynitride layer by supplying an oxygen-containing gas and an inert gas into the processing vessel (step 3), with this sequence set as one cycle. Then, by controlling the partial pressure of the oxygen-containing gas in the processing vessel in changing the metal nitride layer to the metal oxynitride layer (step 3), the composition of the metal oxynitride film having a specific film thickness is controlled.

For example, when the zirconium oxynitride film (ZrON film) is formed on the substrate, by performing multiple numbers of times a cycle of forming a zirconium-containing layer on the substrate by supplying a source gas containing zirconium into a processing vessel in which the substrate is housed (step 1), changing the zirconium-containing layer to a zirconium nitride layer by supplying a nitrogen-containing gas into the processing vessel (step 2), and changing the zirconium nitride layer to a zirconium oxynitride layer by supplying an oxygen-containing gas and an inert gas into the processing vessel (step 3), with this sequence as one cycle. Then, by controlling the partial pressure of the oxygen-containing gas in the processing vessel in changing the zirconium nitride layer to the zirconium oxynitride layer (step 3), the composition of the zirconium oxynitride film having a specific film thickness is controlled. As the source gas containing zirconium, for example, TEMAZ (Tetrakis (ethylmethylamino) zirconium:Zr[N(C₂H₅)(CH₃)]₄) gas can be used. As the nitrogen-containing gas and the oxygen-containing gas, similarly to the above-mentioned embodiment, the NH₃ gas and the O₂ gas can be respectively used. In this case, the first gas supply system (source gas supply system) of the substrate processing apparatus in the above-mentioned embodiment, is configured as a zirconium source gas supply system. Further, a condition in the range of the processing condition described in the above-mentioned embodiment for example, is used as the processing condition in each step. However, in step 1, preferably the temperature of the wafer is set to 100 to 400° C., the inner pressure of the process chamber is set to 1 to 1000 Pa for example, the supply flow rate of the TEMAZ gas is set to 10 to 2000 sccm, the supply flow rate of the N₂ gas is set to 100 to 2000 sccm, and the supply flow time of the TEMAZ gas is set to 1 to 120 seconds for example. Step 2 and step 3 are preferably performed under similar conditions as the processing conditions in steps 2, 3 described in the above-mentioned embodiment.

Further, for example, when the titanium oxynitride film (TiON film) is formed on the substrate, the titanium oxynitride film having a specific film thickness is formed on the substrate by performing multiple numbers of times a cycle of forming a titanium-containing layer on a substrate by supplying a source gas containing titanium into a processing vessel in which the substrate is housed (step 1), changing the titanium-containing layer to a titanium nitride layer by supplying a nitrogen-containing gas into the processing vessel (step 2), and changing the titanium nitride layer to a titanium oxynitride layer by supplying an oxygen-containing gas and an inert gas into the processing vessel (step 3), with this sequence as one cycle. Then, by controlling the partial pressure of the oxygen-containing gas in the processing vessel in changing the titanium nitride layer to the titanium oxynitride layer (step 3), the composition of the titanium oxynitride film having the specific film thickness is controlled. As the source gas containing titanium, a titanium tetrachloride (TiCl₄) gas can be used. As the nitrogen-containing gas and the oxygen-containing gas, the NH$_3$ gas and the O$_2$ gas can be respectively used similarly to the above-mentioned embodiment. In this case, the first gas supply system (source gas supply system) of the substrate processing apparatus in the above-mentioned embodiment is configured as a titanium source gas supply system. Further, a condition in the range of the processing condition described in the above-mentioned embodiment for example, is used as the processing condition in each step. However, in step 1, preferably the temperature of the wafer is set to 100 to 500° C., the inner pressure of the process chamber is set to 1 to 1000 Pa for example, the supply flow rate of the TiCl$_4$ gas is set to 10 to 2000 sccm, the supply flow rate of the N$_2$ gas is set to 100 to 2000 sccm, and the supply flow time of the TiCl$_4$ gas is set to 1 to 120 seconds for example. Step 2 and step 3 are preferably performed under similar conditions as the processing conditions in steps 2, 3 described in the above-mentioned embodiment.

Further, for example, when the tantalum oxynitride film (TaON film) is formed on the substrate, the tantalum oxynitride film having a specific film thickness is formed on the substrate by performing multiple numbers of times a cycle of forming a tantalum-containing layer on a substrate by supplying a source gas containing tantalum into a processing vessel in which the substrate is housed (step 1), changing the tantalum-containing layer to a tantalum nitride layer by supplying a nitrogen-containing gas into the processing vessel (step 2), changing the tantalum nitride layer to a tantalum oxynitride layer by supplying an oxygen-containing gas and an inert gas into the processing vessel (step 3), with this sequence as one cycle. Then, by controlling the partial pressure of the oxygen-containing gas in the processing vessel in changing the tantalum layer to the tantalum oxynitride layer (step 3), the composition of the tantalum oxynitride film having the specific film thickness is controlled. As the source gas containing tantalum, for example, a tantalum pentachloride (TaCl$_5$) gas can be used. As the nitrogen-containing gas and the oxygen-containing gas, the NH$_3$ gas and the O$_2$ gas can be respectively used similarly to the above-mentioned embodiment. In this case, the first gas supply system (source gas supply system) of the substrate processing apparatus in the above-mentioned embodiment is configured as a tantalum source gas supply system. Further, a condition in the range of the processing condition described in the above-mentioned embodiment for example, is used as the processing condition in each step. However, in step 1, preferably the temperature of the wafer is set to 100 to 500° C., the inner pressure of the process chamber is set to 1 to 1000 Pa for example, the supply flow rate of the TaCl$_5$ gas is set to 10 to 2000 sccm for example, the supply flow rate of the N$_2$ gas is set to 100 to 2000 sccm, and the supply flow time of the TaCl$_5$ gas is set to 1 to 120 seconds for example. Step and step 3 are preferably performed under similar conditions as the processing conditions in steps 2, 3 described in the above-mentioned embodiment.

Preferable aspects of the present invention will be supplementarily described hereafter.

According to an aspect of the present invention, there is provided a method of manufacturing a semiconductor device, including:

forming an oxynitride film having a specific film thickness on a substrate by performing multiple numbers of times a cycle of:

forming a specific element-containing layer on the substrate by supplying a source gas containing a specific element into a processing vessel in which the substrate is housed;

changing the specific element-containing layer to a nitride layer by supplying a nitrogen-containing gas into the processing vessel; and changing the nitride layer to an oxynitride layer by supplying an oxygen-containing gas and an inert gas into the processing vessel, with this sequence as one cycle, wherein a composition ratio of the oxynitride film having the specific film thickness is controlled by controlling a partial pressure of the oxygen-containing gas in the processing vessel, in changing the nitride layer to the oxynitride layer.

Preferably, the oxygen-containing gas and the inert gas are supplied through a multiple-hole nozzle having a plurality of gas supply holes on a side face thereof.

Further preferably, a plurality of substrates are arranged in the processing vessel, and the multiple-hole nozzle is disposed in a region horizontally surrounding a substrate arrangement region in which the plurality of substrates are arranged.

Further preferably, the multiple-hole nozzle is provided along the substrate arrangement region so as to rise from at least one end side of the substrate arrangement region toward the other end side.

Further preferably, a total flow rate of a mixed gas of the oxygen-containing gas and the inert gas supplied into the multiple-hole nozzle, is set to a flow rate of a minimal requirement or more for obtaining a uniform flow rate of the mixed gas sprayed from each of the gas supply holes of the multiple-hole nozzle.

Further preferably, the partial pressure of the oxygen-containing gas in the processing vessel is controlled by controlling a supply flow rate of the inert gas.

Further preferably, the partial pressure of the oxygen-containing gas in the processing vessel is controlled by controlling the supply flow rate of the inert gas in a state that a pressure in the processing vessel is set in a specific pressure zone.

Further preferably, by controlling the partial pressure of the oxygen-containing gas in the processing vessel in changing the nitride layer to the oxynitride layer, a ratio of an oxygen-component and a nitrogen-component of the oxynitride film having the specific film thickness is controlled.

Further preferably, by controlling the partial pressure of the oxygen-containing gas in the processing vessel in changing the nitride layer to the oxynitride layer, a refractive index or a wet etching rate of the oxynitride film having the specific film thickness is controlled.

Further preferably, by controlling the partial pressure of the oxygen-containing gas in the processing vessel in changing the nitride layer to the oxynitride layer, a refractive index of the oxynitride film having the specific film thickness is controlled to be 1.45 to 2.0.

Further preferably, by controlling the partial pressure of the oxygen-containing gas in the processing vessel in changing the nitride layer to the oxynitride layer, the wet etching rate of the oxynitride film having the specific film thickness is controlled to be 1.5 to 20 nm/min.

Further preferably, the specific element is a semiconductor element.

Further preferably, the specific element is silicon.

Further preferably, the specific element is a metal element.

Further preferably, the specific element-containing layer is a deposition layer of the specific element.

Further preferably, the specific element-containing layer is a layer formed by deposition of the specific element on the substrate.

Further preferably, the specific element-containing layer is an adsorption layer of the source gas.

Further preferably, the specific element-containing layer is a layer formed by adsorption of the source gas on the substrate.

Further preferably, a thermally activated nitrogen-containing gas is supplied to the substrate in the processing vessel, in changing the specific element-containing layer to the nitride layer.

Further preferably, the thermally activated oxygen-containing gas is supplied to the substrate in the processing vessel together with the inert gas, in changing the nitride layer to the oxynitride layer.

According to other aspect of the present invention, there is provided a method of manufacturing a semiconductor device, including:

forming an oxynitride film having a specific film thickness on a substrate by performing multiple numbers of times a cycle of:

forming a specific element-containing layer on the substrate by supplying a source gas containing a specific element into a processing vessel in which the substrate is housed; and changing the specific element-containing layer to an oxynitride layer by supplying a nitrogen-containing gas, an oxygen-containing gas, and an inert gas into the processing vessel;

with this sequence as one cycle, wherein a composition of the oxynitride film having the specific film thickness is controlled by controlling a partial pressure of the oxygen-containing gas in the processing vessel, in changing the specific element-containing layer to the oxynitride layer.

According to other aspect of the present invention, there is provided a substrate processing method, including:

forming an oxynitride film having a specific film thickness on a substrate by performing multiple numbers of times a cycle of:

forming a specific element-containing layer on the substrate by supplying a source gas containing a specific element into a processing vessel in which the substrate is housed;

changing the specific element-containing layer to a nitride layer by supplying a nitrogen-containing gas into the processing vessel; and changing the nitride layer to an oxynitride layer by supplying an oxygen-containing gas and an inert gas into the processing vessel, with this sequence as one cycle, wherein a composition ratio of the oxynitride film having the specific film thickness is controlled by controlling a partial pressure of the oxygen-containing gas in the processing vessel, in changing the nitride layer to the oxynitride layer.

According to other aspect of the present invention, there is provided a substrate processing apparatus, including:

a processing vessel configured to house a substrate;

a source gas supply system configured to supply a source gas containing a specific element into the processing vessel;

a nitrogen-containing gas supply system configured to supply a nitrogen-containing gas into the processing vessel;

an oxygen-containing gas supply system configured to supply an oxygen-containing gas into the processing vessel;

an inert gas supply system configured to supply an inert gas into the processing vessel;

a partial pressure control system configured to control a partial pressure of a gas in the processing vessel; and a control part configured to control the source gas supply system, the nitrogen-containing gas supply system, the oxygen-containing gas supply system, the inert gas supply system, and the partial pressure control system, so as to perform processing of forming an oxynitride film having a specific film thickness on the substrate by performing multiple numbers of times a cycle of a process of forming a specific element-containing layer on the substrate by supplying the source gas into the processing vessel in which the substrate is housed, a process of changing the specific element-containing layer to a nitride layer by supplying the nitrogen-containing gas into the processing vessel, and a process of changing the nitride layer to an oxynitride layer by supplying the oxygen-containing gas and the inert gas into the processing vessel, with these processes as one cycle, and so as to control a composition ratio of the oxynitride film having the specific film thickness by controlling a partial pressure of the oxygen-containing gas in the processing vessel, in the process of changing the nitride layer to the oxynitride layer.

According to further other aspect of the present invention, there is provided a program, for making a computer execute:

a procedure of forming an oxynitride film having a specific film thickness on a substrate by performing multiple numbers of times a cycle of:

a procedure of forming a specific element-containing layer on the substrate by supplying a source gas containing a specific element into a processing vessel in which the substrate is housed, in a substrate processing apparatus;

a procedure of changing the specific element-containing layer to a nitride layer by supplying a nitrogen-containing gas into the processing vessel; and a procedure of changing the nitride layer to an oxynitride layer by supplying an oxygen-containing gas and an inert gas into the processing vessel, with these procedures as one cycle, and a procedure of controlling a composition ratio of the oxynitride film having the specific film thickness by controlling a partial pressure of the oxygen-containing gas in the processing vessel in the procedure of changing the nitride layer to the oxynitride layer.

According to further other aspect of the present invention, there is provided a computer readable recording medium, recording a program for making a computer execute:

a procedure of forming an oxynitride film having a specific film thickness on a substrate by performing multiple numbers of times a cycle of:

a procedure of forming a specific element-containing layer on the substrate by supplying a source gas containing a specific element into a processing vessel in which the substrate is housed, in a substrate processing apparatus;

a procedure of changing the specific element-containing layer to a nitride layer by supplying a nitrogen-containing gas into the processing vessel; and a procedure of changing the nitride layer to an oxynitride layer by supplying an oxygen-containing gas and an inert gas into the processing vessel, with these procedures as one cycle, and a procedure of controlling a composition ratio of the oxynitride film having the specific film thickness by controlling a partial pressure of the oxygen-containing gas in the processing vessel in the procedure of changing the nitride layer to the oxynitride layer.

DESCRIPTION OF SIGNS AND NUMERALS

121 Controller
200 Wafer
201 Processing chamber
202 Processing furnace
203 Reaction tube 207 Heater
231 Exhaust tube
232a First gas supply tube
232b Second gas supply tube
232c Third gas supply tube
232d First inert gas supply tube
232e Second inert gas supply tube
232f Third inert gas supply tube
241a Mass flow controller
241b Mass flow controller
241c Mass flow controller
241d Mass flow controller
241e Mass flow controller
241f Mass flow controller
244 APC valve
245 Pressure sensor
246 Vacuum pump

The invention claimed is:

1. A method of manufacturing a semiconductor device, comprising:
   forming an oxynitride film having a specific film thickness on a substrate by performing multiple numbers of times a cycle of:
   forming a specific element-containing layer on the substrate by supplying a source gas containing a specific element into a processing vessel in which the substrate is housed; and
   changing the specific element-containing layer to an oxynitride layer by supplying a nitrogen-containing gas, an oxygen-containing gas and an inert gas into the processing vessel simultaneously,
   with this sequence as one cycle,
   wherein a composition ratio of the oxynitride film having the specific film thickness is controlled and a wet etching rate of the oxynitride film having the specific film thickness is controlled to be 1.5 to 20nm/min, by controlling a partial pressure of the oxygen-containing gas in the processing vessel, in changing the specific element-containing layer to the oxynitride layer.

2. The method of manufacturing a semiconductor device according to claim 1, wherein the nitrogen-containing gas, the oxygen-containing gas and the inert gas are supplied through a multiple-hole nozzle having a plurality of gas supply holes on a side face thereof.

3. The method of manufacturing a semiconductor device according to claim 2, wherein a plurality of substrates are arranged in the processing vessel, and the multiple-hole nozzle is disposed in a region horizontally surrounding a substrate arrangement region in which the plurality of substrates are arranged.

4. The method of manufacturing a semiconductor device according to claim 3, wherein the multiple-hole nozzle is provided along the substrate arrangement region so as to rise from at least one end side of the substrate arrangement region toward the other end side.

5. The method of manufacturing a semiconductor device according to claim 4, wherein a total flow rate of a mixed gas of the nitrogen-containing gas, the oxygen-containing gas and the inert gas supplied into the multiple-hole nozzle, is set to a flow rate of a minimal requirement or more for obtaining a uniform flow rate of the mixed gas sprayed from each of the gas supply holes of the multiple-hole nozzle.

6. The method of manufacturing a semiconductor device according to claim 5, wherein the partial pressure of the oxygen-containing gas in the processing vessel is controlled by controlling a supply flow rate of the inert gas.

7. The method of manufacturing a semiconductor device according to claim 6, wherein the partial pressure of the oxygen-containing gas in the processing vessel is controlled by controlling the supply flow rate of the inert gas in a state that a pressure in the processing vessel is set in a specific pressure zone.

8. The method of manufacturing a semiconductor device according to claim 1, wherein by controlling the partial pressure of the oxygen-containing gas in the processing vessel in changing the specific element-containing layer to the oxynitride layer, a ratio of an oxygen-component and a nitrogen-component of the oxynitride film having the specific film thickness is controlled.

9. A substrate processing method, comprising:
   forming an oxynitride film having a specific film thickness on a substrate by performing multiple numbers of times a cycle of:
   forming a specific element-containing layer on the substrate by supplying a source gas containing a specific element into a processing vessel in which the substrate is housed; and
   changing the specific element-containing layer to an oxynitride layer by supplying a nitrogen-containing gas, an oxygen-containing gas and an inert gas into the processing vessel simultaneously,
   with this sequence as one cycle,
   wherein a composition ratio of the oxynitride film having the specific film thickness is controlled and a wet etching rate of the oxynitride film having the specific film thickness is controlled to be 1.5 to 20nm/min, by controlling a partial pressure of the oxygen-containing gas in the processing vessel, in changing the specific element-containing layer to the oxynitride layer.

10. A substrate processing apparatus, comprising:
    a processing vessel configured to house a substrate;
    a source gas supply system configured to supply a source gas containing a specific element into the processing vessel;
    a nitrogen-containing gas supply system configured to supply a nitrogen-containing gas into the processing vessel;
    an oxygen-containing gas supply system configured to supply an oxygen-containing gas into the processing vessel;
    an inert gas supply system configured to supply an inert gas into the processing vessel;
    a partial pressure control system configured to control a partial pressure of a gas in the processing vessel; and
    a control part configured to control the source gas supply system, the nitrogen-containing gas supply system, the oxygen-containing gas supply system, the inert gas supply system, and the partial pressure control system, so as to perform processing of forming an oxynitride film having a specific film thickness on the substrate by performing multiple numbers of times a cycle of a process of forming a specific element-containing layer on the substrate by supplying the source gas into the processing vessel in which the substrate is housed, and a process of changing the specific element-containing layer to an oxynitride layer by supplying the nitrogen-containing gas, the oxygen-containing gas and the inert gas into the processing vessel simultaneously, with these processes as one cycle, and so as to control a composition ratio of the oxynitride film having the specific film thickness and control a wet etching rate of the oxynitride film having the specific film thickness to be 1.5 to 20 nm/min, by controlling a partial pressure of the oxygen-containing gas in the processing vessel, in the process of changing the specific element-containing layer to the oxynitride layer.

11. The method of manufacturing a semiconductor device according to claim 1, wherein a refractive index of the oxynitride film having the specific film thickness is controlled by controlling the partial pressure of the oxygen-containing gas in the processing vessel, in changing the specific element-containing layer to the oxynitride layer.

12. The method of manufacturing a semiconductor device according to claim 1, wherein a refractive index of the oxynitride film having the specific film thickness is controlled to be 1.45 to 2.0 by controlling the partial pressure of the oxygen-containing gas in the processing vessel, in changing the specific element-containing layer to the oxynitride layer.

13. The method of manufacturing a semiconductor device according to claim 1, wherein at least the nitrogen-containing gas and the oxygen-containing gas are supplied through the same nozzle.

14. The method of manufacturing a semiconductor device according to claim 1, wherein the nitrogen-containing gas, the oxygen-containing gas and the inert gas are supplied through the same nozzle.

* * * * *